(12) United States Patent
Wilcoxson et al.

(10) Patent No.: US 6,744,213 B2
(45) Date of Patent: Jun. 1, 2004

(54) ANTENNA FOR PRODUCING UNIFORM PROCESS RATES

(75) Inventors: Mark H. Wilcoxson, Piedmont, CA (US); Andrew D. Bailey, III, Pleasanton, CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 10/374,868

(22) Filed: Feb. 24, 2003

(65) Prior Publication Data
US 2003/0189524 A1 Oct. 9, 2003

Related U.S. Application Data

(63) Continuation-in-part of application No. 10/325,722, filed on Dec. 19, 2002, which is a continuation-in-part of application No. 10/033,807, filed on Dec. 18, 2001, now Pat. No. 6,518,705, said application No. 10/325,722, filed on Dec. 19, 2002, is a continuation-in-part of application No. 09/977,569, filed on Oct. 12, 2001, now Pat. No. 6,653,791, which is a continuation-in-part of application No. 09/440,418, filed on Nov. 15, 1999, now Pat. No. 6,320,320.

(51) Int. Cl.$^7$ .................................................. H01J 7/24
(52) U.S. Cl. ............................ 315/111.51; 315/111.21; 315/111.41
(58) Field of Search ................. 315/111.21, 111.41, 315/111.51, 111.81, 111.91; 156/345; 219/121.43; 118/723 I, 723 R, 723 MR, 723 WR; 343/742

(56) References Cited

U.S. PATENT DOCUMENTS

| 5,698,036 A | * 12/1997 | Ishii et al. ............ 118/723 MW |
| 6,028,395 A | 2/2000 | Holland et al. .......... 315/111.51 |
| 6,089,182 A | * 7/2000 | Hama ...................... 118/723 I |
| 6,302,966 B1 | 10/2001 | Bailey, III et al. ........... 118/724 |
| 6,320,320 B1 | 11/2001 | Bailey, III et al. ....... 315/111.51 |
| 6,322,661 B1 | 11/2001 | Bailey, III et al. ............ 156/345 |
| 6,341,574 B1 | 1/2002 | Bailey, III et al. ......... 118/723 I |
| 6,514,376 B1 | * 2/2003 | Collins et al. .......... 156/345.37 |

FOREIGN PATENT DOCUMENTS

| EP | 0813227 A2 | 12/1997 | ............ H01J/37/32 |
| JP | 09069399 | 3/1997 | ............ H05H/1/46 |
| WO | 01/45134 A2 | 6/2001 | ............ H01J/37/00 |

OTHER PUBLICATIONS

International Search Report, date mailed Mar. 25, 2003.
U.S. patent application No. 09/440,794, entitled "Materials and Gas Chemistries for Processing Systems", filed Nov. 15, 1999, inventors: Bailey et al.
U.S. patent application No. 09/470,236, entitled "Plasma Processing System with Dynamic Gas Distribution Control", filed Nov. 15, 1999, inventors: Bailey et al.
U.S. patent application No. 09/977,569, entitled Method and Apparatus for Producing Uniform Process Rates, filed Oct. 12, 2001, inventors: Bailey et al.

* cited by examiner

Primary Examiner—Wilson Lee
Assistant Examiner—Jimmy T. Vu
(74) Attorney, Agent, or Firm—Beyer Weaver & Thomas, LLP

(57) ABSTRACT

An antenna arrangement for generating an electric field inside a process chamber through a window. Generally, the antenna arrangement comprises an outer loop, comprising a first outer loop turn disposed around an antenna axis, an inner loop, comprising a first inner loop turn disposed around the antenna axis, wherein the inner loop is closer to the antenna axis than the outer loop is to the antenna axis in each azimuthal direction, and a radial connector radially electrically connecting the outer loop to the inner loop, wherein the radial connector is placed a large distance from the window.

19 Claims, 15 Drawing Sheets

ANTENNA FOR PRODUCING UNIFORM PROCESS RATES

RELATED APPLICATIONS

This application claims priority under 35 USC 119(e) from the Provisional Application No. 60/308,469 entitled "Antenna Design," which was filed on Jul. 27, 2001 and is a continuation-in-part of U.S. patent application Ser. No. 10/325,722 entitled "Method And Apparatus For Producing Uniform Process Rates," by Wilcoxson et al. filed Dec. 19, 2002, which is a continuation of U.S. patent application Ser. No. 10/033,807 entitled "Method And Apparatus For Producing Uniform Process Rates," by Wilcoxson et al. filed Dec. 18, 2001 now U.S. Pat. No. 6,518,705, which is a continuation in part of Ser. No. 09/440,418 filed Nov. 15, 1999 now U.S. Pat. No. 6,320,320 entitled "Method And Apparatus For Producing Uniform Process Rates," by Bailey, III et al. issued Nov. 20, 2001 and U.S. patent application Ser. No. 09/977,569 filed Oct. 12, 2001 now U.S. Pat. No. 6,653,791 which is a continuation of Ser. No. 09/440,418 filed Nov. 15, 1999 now U.S. Pat. No. 6,320, 320; said applications and patents are hereby incorporated by reference.

BACKGROUND OF THE INVENTION

The present invention relates to apparatus and methods for processing substrates such as semiconductor substrates for use in IC fabrication or glass panels for use in flat panel display applications. More particularly, the present invention relates to improved plasma processing systems that are capable of processing substrates with a high degree of processing uniformity across the substrate surface.

Plasma processing systems have been around for some time. Over the years, plasma processing systems utilizing inductively coupled plasma sources, electron cyclotron resonance (ECR) sources, capacitive sources, and the like, have been introduced and employed to various degrees to process semiconductor substrates and glass panels.

During processing, multiple deposition and/or etching steps are typically employed. During deposition, materials are deposited onto a substrate surface (such as the surface of a glass panel or a wafer). For example, deposited layers such as various forms of silicon, silicon dioxide, silicon nitride, metals and the like may be formed on the surface of the substrate. Conversely, etching may be employed to selectively remove materials from predefined areas on the substrate surface. For example, etched features such as vias, contacts, or trenches may be formed in the layers of the substrate.

One particular method of plasma processing uses an inductive source to generate the plasma. FIG. 1 illustrates a prior art inductive plasma processing reactor 100 that is used for plasma processing. A typical inductive plasma processing reactor includes a chamber 102 with an antenna or inductive coil 104 disposed above a dielectric window 106. Typically, antenna 104 is operatively coupled to a first RF power source 108. Furthermore, a gas port 110 is provided within chamber 102 that is arranged for releasing gaseous source materials, e.g., the etchant source gases, into the RF-induced plasma region between dielectric window 106 and a substrate 112. Substrate 112 is introduced into chamber 102 and disposed on a chuck 114, which generally acts as an electrode and is operatively coupled to a second RF power source 116.

In order to create a plasma, a process gas is input into chamber 102 through gas port 110. Power is then supplied to inductive coil 104 using first RF power source 108. The supplied RF energy couples through the dielectric window 106 and a large electric field is induced inside chamber 102. More specifically, in response to the electric field, a circulating current is induced in chamber 102. The electric field accelerates the small number of electrons present inside the chamber causing them to collide with the gas molecules of the process gas. These collisions result in ionization and initiation of a discharge or plasma 118. As is well known in the art, the neutral gas molecules of the process gas when subjected to these strong electric fields lose electrons, and leave behind positively charged ions. As a result, positively charged ions, negatively charged electrons and neutral gas molecules (and/or atoms) are contained inside the plasma 118. As soon as the creation rate of free electrons exceeds their loss rate, the plasma ignites.

Once the plasma has been formed, neutral gas molecules inside the plasma tend to be directed towards the surface of the substrate. By way of example, one of the mechanism contributing to the presence of the neutrals gas molecules at the substrate may be diffusion (i.e., the random movement of molecules inside the chamber). Thus, a layer of neutral species (e.g., neutral gas molecules) may typically be found along the surface of substrate 112. Correspondingly, when bottom electrode 114 is powered, ions tend to accelerate towards the substrate where they, in combination with neutral species, activate the etching reaction.

One problem that has been encountered with inductive plasma systems, such as the one mentioned above, has been variations in the etch performance across the substrate, e.g., a non-uniform etch rate. That is, one area of the substrate gets etched differently than another area. As a result, it is extremely difficult to control the parameters associated with the integrated circuit, i.e., critical dimensions, aspect ratios, and the like. Additionally, a non-uniform etch rate may lead to device failure in the semiconductor circuit, which typically translates into higher costs for the manufacturer. Moreover, there also exist other issues of concern such as the overall etch rate, etch profile, micro-loading, selectivity, and the like.

In recent years, it has been found that these non-uniform etch rates may be the result of variations in the plasma density across the surface of the substrate, i.e., a plasma that has regions with greater or lesser amounts of reactive species (e.g., positively charged ions). While not wishing to be bound by theory, it is believed that the variations in plasma density are created by asymmetries that are found in the power transmission characteristics of the power coupling, e.g., antenna, the dielectric window, and/or plasma. If the power coupling is asymmetric, it stands to reason that the circulating current of the induced electric field will be asymmetric, and therefore the ionization and initiation of the plasma will be asymmetric. As a result, variations in the plasma density will be encountered. For example, some antenna arrangements induce a current that is strong in the center of the coil, and weak at the outer diameter of the coil. Correspondingly, the plasma tends to congregate towards the center of the process chamber (as shown in FIG. 1 by plasma 118).

The standard technique for overcoming an asymmetric power coupling has been to compensate or balance out the asymmetries. For example, using a pair of planar antennas to increase the current density at weak current areas, joining radial members to a spiral antenna to form more circular loops at different radii, varying the thickness of the dielectric window to decrease the current density at strong current areas. However, these balancing techniques tend not to provide an azimuthally symmetric power coupling. That is, they still tend to have azithmuthal variations that lead to variations in the plasma, which makes it difficult to obtain etch uniformity.

Moreover, most antenna arrangements used today form some type of capacitive coupling between the antenna and the plasma. Capacitive coupling is created by a voltage drop between the antenna and the plasma. The voltage drop typically forms a sheath voltage at or near the coupling window. For the most part, the sheath voltage tends to act like the bottom electrode (powered). That is, the ions in the plasma tend to be accelerated across the sheath, and therefore accelerate towards the negatively charged coupling window. As a result, the accelerating ions tend to bombard the surface of the coupling window.

These bombarding ions will have substantially the same effect on the coupling window as they do on the substrate, i.e., they will either etch or deposit material on the coupling window surface. This may produce undesirable and/or unpredictable results. For example, deposited material may accumulate on the coupling window and become the source of harmful particulate, especially when material flakes off onto the substrate surface. Removing material from the coupling window will have a similar effect. Eventually, the increase or decrease in thickness will cause process variation, for example, in the power transmission properties of the power coupling (e.g., antenna, dielectric window, plasma). As mentioned, process variation may lead to non-uniform processing, which lead to device failure in the semiconductor circuit.

In view of the foregoing, there are desired improved methods and apparatuses for producing uniform processing at the surface of the substrate.

SUMMARY OF THE INVENTION

The invention relates, in one embodiment to an antenna arrangement for generating an electric field inside a process chamber through a window. Generally, the antenna arrangement comprises an outer loop, comprising a first outer loop turn disposed around an antenna axis, an inner loop, comprising a first inner loop turn disposed around the antenna axis, wherein the inner loop is closer to the antenna axis than the outer loop is to the antenna axis in each azimuthal direction, and a radial connector radially electrically connecting the outer loop to the inner loop, wherein the radial connector is placed a large distance from the window.

The invention relates, in another embodiment to a plasma processing apparatus for processing a substrate. Generally, a process chamber is provided in which a plasma is both ignited and sustained for the processing. A window forms a side of the process chamber configured to allow the passage of said RF energy into said process chamber. A multi-layered antenna is adjacent to the window and configured to produce an electric field via RF energy inside said process chamber. The multi-layer antenna comprises an outer loop, comprising a first outer loop turn disposed around the antenna axis, an inner loop, comprising a first inner loop turn disposed around the antenna axis, wherein the inner loop is closer to the antenna axis than the outer loop is to the antenna axis in each azimuthal direction, and a radial connector radially electrically connecting the outer loop to the inner loop, wherein the radial connector is placed a large distance from the window.

BRIEF DESCRIPTION OF THE DRAWINGS

The present invention is illustrated by way of example, and not by way of limitation, in the figures of the accompanying drawings and in which like reference numerals refer to similar elements and in which:

FIG. 16 is a cross-sectional view of turns with an insulator disposed there between.

DETAILED DESCRIPTION OF PREFERRED EMBODIMENTS

Figure 1:
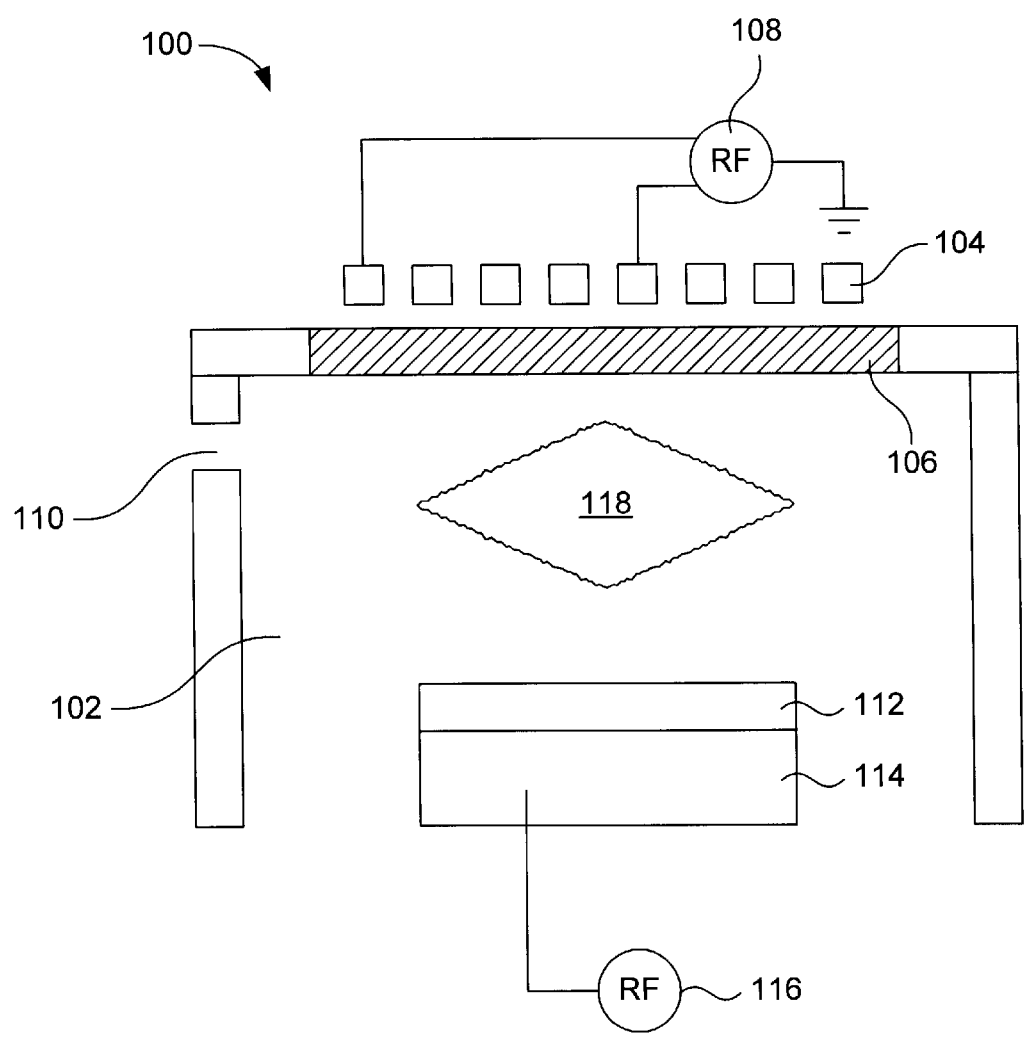
FIG. 1 illustrates a prior art inductive plasma processing reactor that is used for plasma processing.

The present invention will now be described in detail with reference to a few preferred embodiments thereof and as illustrated in the accompanying drawings. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

In processing substrates, one of the most important parameters that process engineers strive to improve is process uniformity. As the term is employed herein, etch uniformity refers to the uniformity of the entire etch process across the substrate surface including etch rate, microloading, mask selectivity, underlayer selectivity, critical dimension control, and profile characteristics like sidewall angle and roughness. If the etch is highly uniform, for example, it is expected that the etch rates at different points on the substrate tend to be substantially equal. In this case, it is less likely that one area of the substrate will be unduly over-etched while other areas remain inadequately etched.

The present invention provides a plasma processing system for processing substrates that is capable of producing a uniform etch. The plasma processing system includes an RF power source and a process chamber. The plasma processing system further includes a substantially circular antenna operatively coupled to the RF power source and disposed above a plane defined by a substrate when the substrate is disposed within the process chamber for processing. The substantially circular antenna is configured to induce an electric field inside the process chamber with RF energy generated by the RF power source. The substantially circular antenna has at least a first pair of concentric loops in a first plane. A second pair of concentric loops in a second plane is placed in relation to the first pair of concentric loops. The first pair of concentric loops and the second pair of concentric loops are substantially identical and symmetrically aligned with one another along a common axis. The radial connections between the concentric turns in each loop required to drive current in the same direction in all loops are placed a large distance from the window and the concentric loops. Preferably, radial connectors are placed far from the window and near to each other to provide opposing currents and some canceling of resulting fields.

The plasma processing system further includes a coupling window disposed between the antenna and the process chamber. The coupling window is configured to allow the passage of RF energy from the antenna to the interior of the process chamber. Further, the coupling window has a first layer and a second layer. The second layer is configured to reduce the voltage drop formed between the window and the plasma by absorbing at least a portion of the voltage that passes through the coupling window. The substantially circular antenna and said coupling window are arranged to work together to form an azimuthally symmetric plasma inside the process chamber that produces a substantially uniform process rate across the surface of the substrate.

In accordance with one aspect of the present invention, process uniformity across the substrate surface is achieved by providing an improved antenna arrangement configured for producing a uniform plasma. As mentioned, power is supplied to an antenna to induce an electric field and, consequently, a circulating electric current inside a process chamber. Correspondingly, the electric field accelerates the electrons in the process chamber causing them to collide with the gas molecules of the process gas, which as a result ionizes and initiates the plasma.

Following the creation of the plasma, power is supplied to a lower electrode and the ions are accelerated towards the substrate. The accelerated ions and neutral reactants at the surface of the substrate react with the materials disposed on the substrate surface and therefore process the substrate. In general, when the density of the plasma is greater at one area of the substrate, a non-uniform process rate will be produced. Accordingly, the improved antenna arrangement is configured to reduce these plasma variations by inducing an azimuthally symmetric electric field, and therefore produce a more uniform process rate.

The invention provides an antenna built to as best satisfy the following rules: 1) Compensate for all missing azimuthal currents in each turn with an azimuthal current placed as close as possible to the missing segment or gap. 2) Cancel all non-azimuthal currents with counter currents placed as close as possible. 3) Keep non-azimuthal asymmetric current elements with their private flux far from the window even if they are compensated nearby.

In one embodiment, the improved antenna is configured to produce a circulating current that is azimuthally symmetric. While not wishing to be bound by theory, it is believed that transmission line characteristics of the power coupling create azimuthal variations in the circulating current in response to the induced electric field. These transmission line characteristics tend to produce standing waves that form fluctuating areas of high and low voltage along the length of the antenna, which as a result form fluctuating areas of high and low current densities in the induced electric field, i.e., when the voltage is high, the current is low and when the voltage is low, the current is high. As is well known to those skilled in the art, power deposition into the plasma depends on the current density. For example, where the current density is high the plasma density tends to be high and where the current density is low the plasma density tends to be low. Accordingly, an azimuthally asymmetric plasma is typically produced when the current density has fluctuating areas of high and low current.

To be more specific, when the wavelength of the RF energy is smaller than the length of the antenna more nodes will appear in the standing wave pattern. Generally, standing waves are governed by the equation, antenna electrical length=½ (wavelength)*n, where n=the number of nodes. Most antenna arrangements are about 1½ to about 2½ wavelengths in length, and as a result produce about 3 to 5 nodes. These nodes correspond to the low voltages mentioned above.

The improved antenna overcomes this disadvantage by being configured to behave as a lumped circuit element in the power delivery system rather than a transmission line. That is, the improved antenna is configured to have an apparent length that is smaller than the wavelength of the RF energy at the operating frequency. As a result, the amount of nodes is reduced and therefore, the azimuthal variations of the induced current are substantially eliminated and the transmission line analogy no longer holds.

In one embodiment, the improved antenna arrangement is a multi-turn antenna that acts like a single turn antenna. The multi-turn antenna is a substantially single conductive element that includes a plurality of loops, which are closely wound and stacked together. By closely winding and stacking the loops together, the overall size (e.g., outer diameter) of the antenna may be made smaller without impacting the strength of the induced circulating current. Further, by decreasing the size of the antenna the overall length of the antenna can be made smaller, which as a result reduces the transmission line characteristics of the antenna. Further still, because the loops are disposed proximate to each other, the radial variation typically found between turns may also be reduced. Correspondingly, the improved antenna arrangement advantageously induces a circulating current that is azimuthally symmetric. Accordingly, the azimuthally symmetric circulating current tends to form an azimuthally symmetric plasma, which as a result, tends to produce uniform plasma processing at the surface of the substrate.

Another aspect of the multi-turn stacked antenna arrangement is the self-shielding characteristics, i.e. the plasma is shielded from the antenna terminal voltage by the turns adjacent to the window. This leads to a significant reduction in capacitive coupling and subsequent window erosion, both of which, will be discussed in greater detail below In accordance with another aspect of the present invention, an improved coupling window is configured to reduce the capacitive coupling that occurs between the antenna and the plasma. Most power coupling arrangements (e.g., antenna, coupling window, and plasma) create some capacitive coupling between the antenna and the plasma. Capacitive coupling is created by a voltage drop that occurs between the antenna and the plasma. This voltage drop typically creates a sheath voltage proximate to the coupling window. As is well known to those skilled in the art, the sheath voltage may lead to additional variations in the plasma, for example, the sheath voltage may push the plasma away from the window causing a reduction in the inductive coupling coefficient. Additionally, the sheath voltage may even produce significant particle contamination due to the bombardment of the ions against the coupling window. Moreover, any power used up by ion bombardment of the window is typically unavailable for plasma generation, which correspondingly causes a lower plasma density for a given power.

In order to reduce the capacitive coupling between the antenna and the plasma, the improved coupling window is configured to include a dielectric layer and a shielding layer that are disposed together. The shielding layer, which is the layer disposed inside the process chamber, is preferably configured to act as a electrostatic shield that directs the voltage away from the surface of the coupling window. The shielding layer essentially suppresses the capacitive coupling to the plasma. Furthermore, the shielding layer is configured to eliminate the capacitive (electrostatic, gradient of a potential) electric field, while leaving the inductive (curl B, grad F=0 type) electric field substantially unchanged. That is, the coupling window is configured to block direct capacitive coupling through the coupling window, while allowing the antenna to inductively form the plasma (without substantial losses to the shielding layer).

More specifically, the shielding layer is electrically isolated and formed from a conducting or semi-conducting material. Therefore, the voltage drop that would normally occur between the antenna and the plasma now occurs between the antenna and the shielding layer. Accordingly, the sheath voltage near the surface of the coupling window is substantially reduced, which as a result increases the inductive coupling coefficient and reduces the power loss due to the unproductive ion bombardment of the coupling window.

Furthermore, an ungrounded electrostatic shield will produce a uniform electrostatic field, shielding only the variations of the electrostatic fields over the area of the shield. This last feature may be used to facilitate striking of the plasma. Additionally, because the shielding layer is exposed to the interior of the process chamber, it is preferably formed from a material that can resist the thermal, chemical and physical effects of plasma processing.

The features and advantages of the present invention may be better understood with reference to the figures and discussions that follow.

Figure 2:
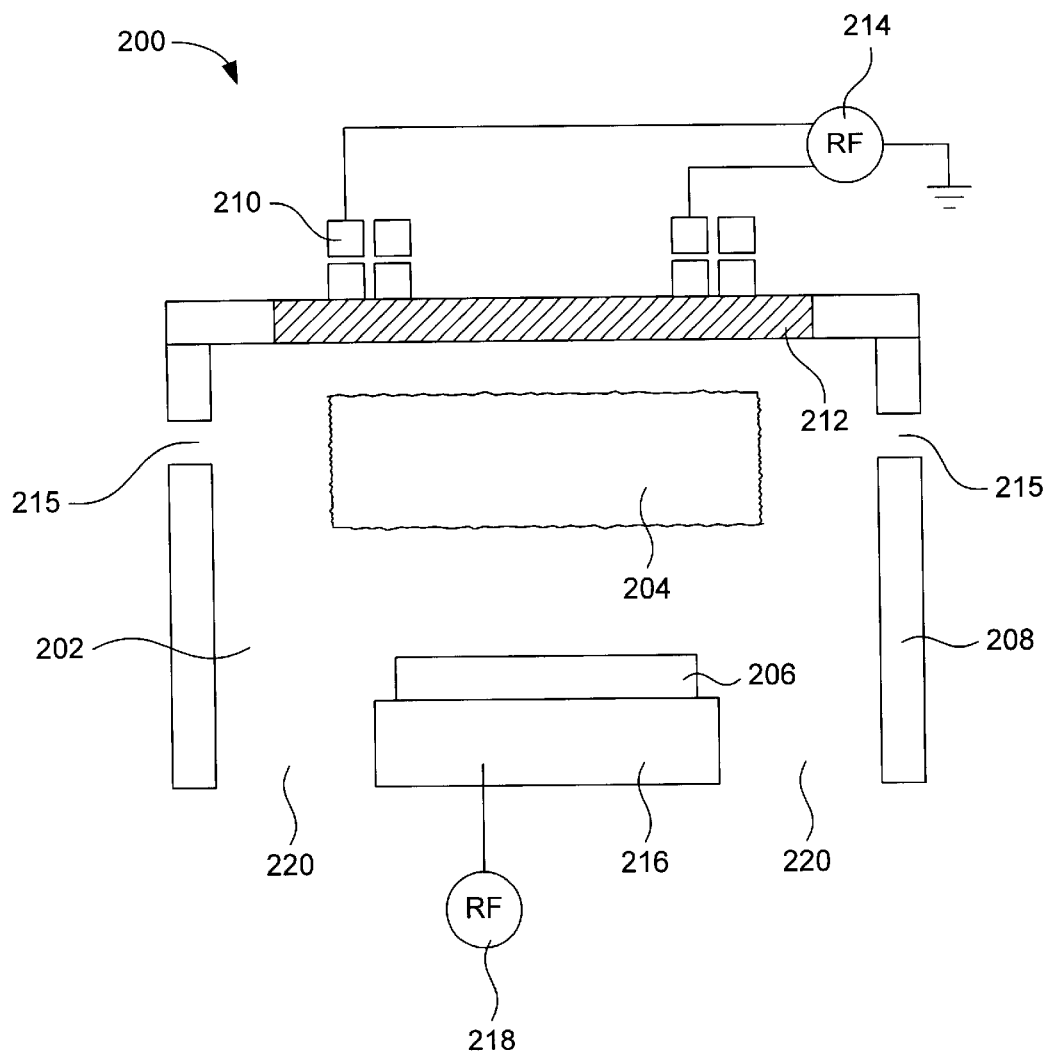
FIG. 2 illustrates a plasma processing system, including an antenna arrangement and a coupling window arrangement, in accordance with one embodiment of the present invention.

FIG. 2 illustrates, in accordance with one embodiment of the present invention, a plasma processing system 200, including a process chamber 202 within which a plasma 204 is both ignited and sustained for processing a substrate 206. Substrate 206 represents the work-piece to be processed, which may represent, for example, a semiconductor substrate to be etched, deposited, or otherwise processed or a glass panel to be processed into a flat panel display. Additionally, process chamber 202 is preferably arranged to be substantially cylindrical in shape, and have substantially vertical chamber walls 208. However, it should be noted that the present invention is not limited to the above and that various configurations of the process chamber may be used.

Plasma processing system 200 further includes an antenna arrangement 210 and a coupling window arrangement 212, which are configured to couple power to plasma 204. Antenna arrangement 210 is coupled to a first RF power supply 214 that is configured to supply antenna arrangement 210 with RF energy having a frequency in the range of about 0.4 MHz to about 50 MHz. Coupling window 212 is configured to allow the passage of the first RF energy from antenna arrangement 210 to the interior of said process chamber. Preferably, coupling window 212 is disposed between substrate 206 and antenna arrangement 210.

Further, antenna arrangement 210 should be sufficiently close to the coupling window to facilitate the formation of plasma 204. That is, the closer the antenna arrangement is to the coupling window, the greater the intensity of the current produced within the chamber. Further still, antenna arrangement 210 is preferably arranged to be co-axial with both process chamber 202, and substrate 206. It should be understood that a symmetric placement of the antenna arrangement may enhance the plasma uniformity across the substrate surface, however, it may not be required for all processes. Antenna arrangement 210 and coupling window 212 will be described in more detail below.

A gas injector 215 is typically provided within chamber 202. Gas injector 215 is preferably disposed around the inner periphery of chamber 202 and is arranged for releasing gaseous source materials, e.g., the etchant source gases, into the RF-induced plasma region between coupling window 212 and substrate 206. Alternatively, the gaseous source materials may also be released from ports built into the walls of the chamber itself or through a showerhead arranged in the dielectric window. It should be understood that a symmetric distribution of gas may enhance the plasma uniformity across the substrate surface, although, it may not be required for all processes. An example of a gas distribution system that may be used in the exemplary plasma processing system is described in greater detail in a co-pending patent application entitled, "PLASMA PROCESSING SYSTEM WITH DYNAMIC GAS DISTRIBUTION CONTROL"; U.S. patent application Ser. No. 09/470,236, filed on Nov. 15, 1999 and incorporated herein by reference.

For the most part, substrate 206 is introduced into chamber 202 and disposed on a chuck 216, which is configured to hold the substrate during processing. Chuck 216 may represent, for example, an ESC (electrostatic) chuck, which secures substrate 206 to the chuck's surface by electrostatic force. Typically, chuck 216 acts as a bottom electrode and is preferably biased by a second RF power source 218. Additionally, chuck 216 is preferably arranged to be substantially cylindrical in shape and axially aligned with process chamber 202 such that the process chamber and the chuck are cylindrically symmetric. Chuck 216 may also be configured to move between a first position (not shown) for loading and unloading substrate 206 and a second position (not shown) for processing the substrate.

Still referring FIG. 2, an exhaust port 220 is disposed between chamber walls 202 and chuck 216. However, the actual placement of the exhaust port may vary according to the specific design of each plasma processing system. In cases where a high degree of uniformity is critical, however, a cylindrically symmetric exhaust port can be quite beneficial. Preferably, exhaust port 220 is configured for exhausting by-product gases formed during processing. Further, exhaust port 220 is coupled to a turbomolecular pump (not shown), typically located outside of chamber 202. As is well known to those skilled in the art, the turbomolecular pump maintains the appropriate pressure inside chamber 202.

Furthermore, in the case of semiconductor processing, such as etch processes, a number of parameters within the processing chamber need to be tightly controlled to maintain high tolerance results. The temperature of the processing chamber is one such parameter. Since the etch tolerance (and resulting semiconductor-based device performance) can be highly sensitive to temperature fluctuations of components in the system, accurate control therefore is required. By way of example, a temperature management system that may be used in the exemplary plasma processing system for achieving temperature control is described in greater detail in a co-pending patent application entitled, "TEMPERATURE CONTROL SYSTEM FOR PLASMA PROCESSING APPARATUS"; U.S. Pat. No. 6,302,966, issued on Oct. 16, 2001 and incorporated herein by reference.

Additionally, another important consideration in achieving tight control over the plasma process is the material utilized for the plasma processing chamber, e.g., the interior surfaces such as the chamber wall. Yet another important consideration are the gas chemistries used to process the substrates. By way of example, both materials and gas chemistries that may be used in the exemplary plasma processing system are described in greater detail in a co-pending patent application entitled, "MATERIALS AND GAS CHEMISTRIES FOR PLASMA PROCESSING SYSTEMS", U.S. patent application Ser. No. 09/440,794, filed on Nov. 15, 1999 and incorporated herein by reference.

In order to create a plasma, a process gas is input into chamber 202 through gas injector 215. Power is then supplied to antenna arrangement 210 using first RF power source 214, and a large electric field is induced inside chamber 202 through coupling window 212. The electric field accelerates the small number of electrons present inside the chamber causing them to collide with the gas molecules of the process gas. These collisions result in ionization and initiation of a discharge or plasma 204. As is well known to those skilled in the art, the neutral gas molecules of the process gas when subjected to these strong electric fields lose electrons, and leave behind positively charged ions. As a result, positively charged ions, negatively charged electrons and neutral gas molecules are contained inside plasma 204.

Once the plasma has been formed, neutral gas molecules inside the plasma tend to be directed towards the surface of the substrate. By way of example, one of the mechanism contributing to the presence of the neutrals gas molecules at the substrate may be diffusion (i.e., the random movement of molecules inside the chamber). Thus, a layer of neutral species (e.g., neutral gas molecules) may typically be found along the surface of substrate 206. Correspondingly, when bottom electrode 216 is powered, ions tend to accelerate towards the substrate where they, in combination with neutral species, activate substrate processing, i.e., etching, deposition and/or the like.

For the most part, plasma 204 predominantly stays in the upper region of the chamber (e.g., active region), however, portions of the plasma may tend to fill the entire chamber. The plasma generally goes where it can be sustained, which is almost everywhere in the chamber. By way of example, the plasma may fill the areas below the substrate such as the bellows of the pumping arrangement (e.g., non-active region). If the plasma reaches these areas, etch, deposition and/or corrosion of the areas may ensue, which may lead to particle contamination inside the process chamber, i.e., by etching the area or flaking of deposited material.

Furthermore, an unconfined plasma tends to form a non uniform plasma, which may lead to variations in the process performance, i.e. etch uniformity, overall etch rate, etch profile, micro-loading, selectivity, and the like. In order to reduce the aforementioned effects, a plasma confinement arrangement may be used to confine the plasma. By way of example, a plasma confinement arrangement that may be used in the exemplary plasma processing system for confining a plasma is described in greater detail in a co-pending patent application entitled, "METHOD AND APPARATUS FOR CONTROLLING THE VOLUME OF PLASMA", U.S. Pat. No. 6,322,661, filed Nov. 27, 2001 and incorporated herein by reference.

According to an aspect of the invention, the plasma processing apparatus is provided with a multi-turn antenna arrangement such that an azimuthally symmetric electric field is induced inside the process chamber of the plasma processing apparatus.

Figure 3:
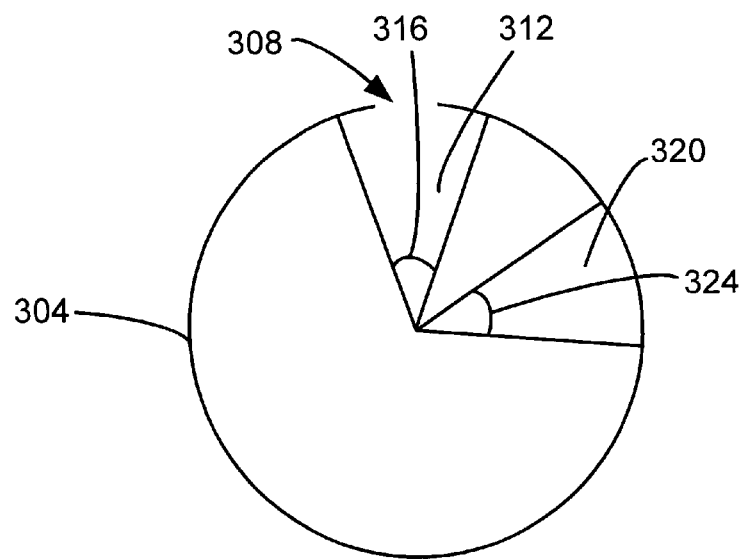
FIG. 3 is a schematic illustration of a partial antenna turn with a gap.

As critical dimensions continue to decrease the tolerances for a plasma that is not azimuthally symmetric also decrease. The antenna turns are incomplete and gaps are provided between the ends of the antenna loops to prevent shorting. Such a gap may prevent the plasma from being azimuthally symmetric. FIG. 3 is a schematic illustration of a partial antenna turn 304 with a gap 308. A first azimuthal sector 312 defined by a first angle 316 contains the gap 308. A second azimuthal sector 320 defined by a second angle 324 does not contain the gap 308. The gap 308 causes the RF power in the first azimuthal sector 312 to be less than the RF power in the second azimuthal sector 320. Various current carrying elements have been used to bridge the gap. The nonsymmetry of such bridging elements may make such elements unable to provide a desired uniformity.

Figure 4:
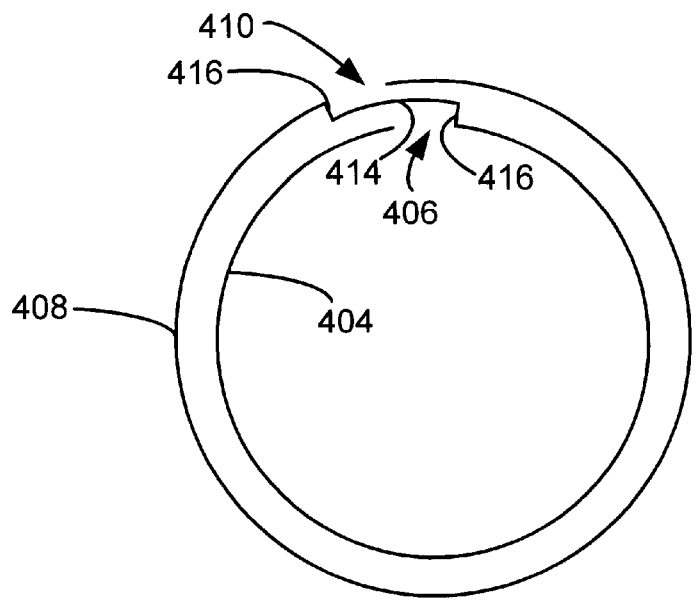
FIG. 4 is a schematic illustration of a multi-turn antenna arrangement.

FIG. 4 is a schematic illustration of two partial antenna turns 404, 408, with gaps 406, 410 respectively. A bridge 414 is provided to compensate for the gaps 406, 410. Radial legs 416 provide an electrical connection between the partial antenna turns 404, 408 and the bridge 414, to provide a complete current path between the two partial antenna turns 404, 408. Although the radial current component may be small and partially compensated by a pair of turns at another level, it has been found that this radial current provides a significant asymmetry. Since these legs are in the same plane as the partial antenna turns 404, 408, the radial current path is "close" to the window. In the specification and claims, a radial current path is defined as being far from the window, if the radial current path is at least three times the distance from the window as the furthest antenna turn. The radial current, which is an azimuthally asymmetric current section induces fields comparable to a similar nearby current section of the antenna itself. The fields drop off proportional to the length of the radial current section divided by the square of the distance. In order to significantly reduce this asymmetric component appearing on the plasma side of the window compared to the desired symmetric antenna contribution, the ratio of distances between the antenna and the plasma side of the window (d1) and the new radial section location (d2) should be less than 10, i.e., $(d1/d2)^2 < 10$ which is approximately $d2 \geq 3*d1$)

Figure 5:
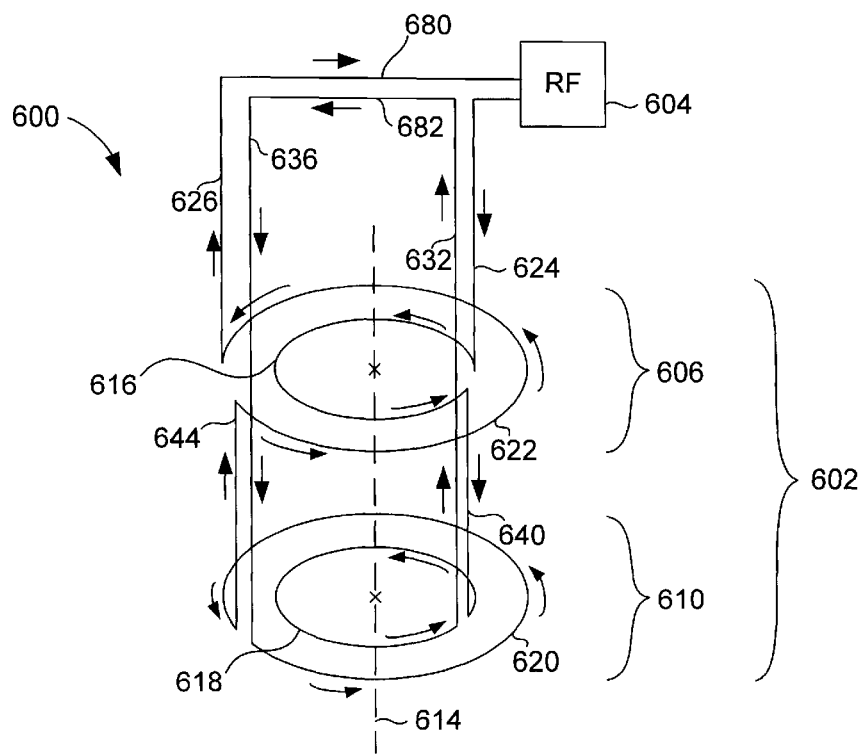
FIG. 5 illustrates the multi-turn antenna arrangement, in accordance with one embodiment of the present invention.
Figure 6:
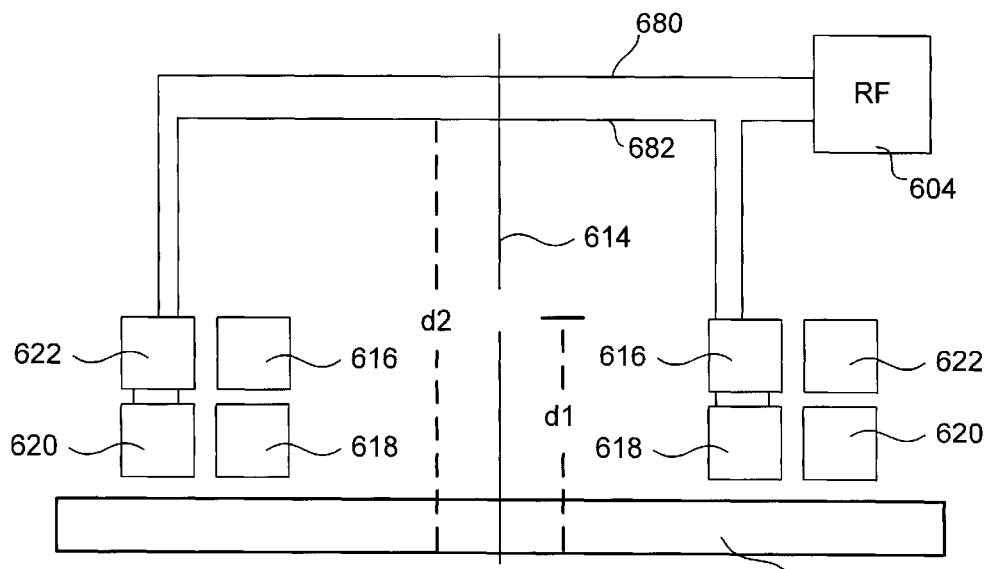
FIG. 6 is a cross sectional side view of the multi-turn antenna arrangement.

FIGS. 5 & 6 illustrate a multi-turn antenna arrangement 600, in accordance to one embodiment of the present invention. The multi-turn antenna arrangement 600 includes a multi-turn antenna 602 operatively coupled to a RF power source 604 which, for example, respectively correspond to the antenna 210 and the RF power source 214 illustrated in FIG. 2.

As mentioned, if the antenna length is small with respect to the wavelength then the transmission line description of the power coupling is no longer appropriate, and the power coupling begins to behave as a lumped circuit element. Therefore, multi-turn antenna 602 is configured to have a length that is smaller than the wavelength of the transmitted energy. By decreasing the length of the antenna, fewer nodes are created in the standing wave pattern, and as a result the high voltage and low voltage areas in the azimuthal direction of the antenna are substantially reduced.

The multi-turn antenna is preferably configured to have multiple turns that are closely disposed together so the electromagnetic field that is produced appears to be from a single turn antenna. More specifically, by placing the turns closer together the current producing capacity of the antenna is increased. For example, if the antenna is formed of four turns that are proximal to one another then the current through the plasma tends to be about four times as strong as in the antenna. Correspondingly, this concentrated current carries over to a concentrated plasma that is more uniform. As a result, the diameter of the antenna, with respect to the diameter of the process chamber, can be made smaller, which in turn decreases the length of the antenna. The actual size of the antenna will be described in greater detail below.

Multi-turn antenna 602 is substantially circular and includes at least a first pair of concentric loops 606 in a first plane and a second pair of concentric loops 610 in a second plane. Preferably, the first pair of concentric loops 606 and the second pair of concentric loops 610 are substantially identical and symmetrically aligned with one another along an antenna axis 614. It should be noted that a substantially circular antenna will produce a substantially circular electric field, which as result will produce a substantially circular plasma. Accordingly, because the process chamber and the substrate are circular it stands to reason that the substantially circular plasma tends to create more uniform processing at the surface of the substrate.

While the present invention has been shown and described as being substantially circular, it should be understood that alternate shapes for applications requiring different shaped substrates such as for displays or for compensation of some asymmetry in chamber design may be used. By way of example, oval shapes, or rectangular shapes with circular corners following the same principles set forth above may also work well.

Furthermore, the first pair of concentric loops 606 are preferably stacked above the second pair of concentric loops 610. Single-plane antennas typically produce an increased amount of capacitive coupling because the terminal voltage and all of the voltage nodes are in direct proximity with the window. However, because of the stacked antenna and the symmetric alignment between the first pair of concentric loops and the second pair of concentric loops, the high terminal voltage is advantageously shielded by the second pair of concentric loops. More specifically, the voltage drop (e.g., capacitive coupling) that would typically occur between the first concentric loop and the plasma is substantially reduced because the second pair of concentric loops provides a conductive path for the voltage drop and therefore the voltage drop will not interact with the plasma.

Additionally, first pair of concentric loops 606 preferably include a first turn 616 and a fourth turn 622, and second pair of concentric loops 610 preferably include a second turn 618 and a third turn 620. Further, first turn 616 is substantially identical to and disposed above second turn 618, and fourth turn 622 is substantially identical to and disposed above third turn 620.

First turn 616 is operatively coupled to second turn 618, second turn 618 is operatively coupled to third turn 620, and third turn 620 is operative coupled to fourth turn 622, with each of the turns being arranged so that the current flow is in the same direction around antenna axis 614. In one implementation, the multi-turn antenna is formed from a single conductive element. However, it should be noted that this is not a limitation and that the multi-turn antenna may be formed from separate parts that are structurally and electrically coupled together. Additionally, multi-turn antenna 602 includes an input lead 624 and an output lead 626, which may be connected to the RF power source 604 via a lead 680.

In this embodiment, the input lead 624 is operatively coupled to a first end of the first turn 616. A second end of the first turn is operatively coupled to a first end of a first connector 640. A second end of the first connector is operatively coupled to a first end of the second turn 618. A second end of the second turn 618 is operatively coupled to a first leg 632 of the radial connection. A second leg 636 of the radial connection is operatively coupled to a first end of the third turn 620. At least where the first and second legs are close to (not far from) the window, the first leg 632 and the second leg 636 are substantially perpendicular to planes defined by the turns 616, 618, 620, 622. More preferably the first and second legs are perpendicular to planes defined by the turns along substantially the entire length of the first and second legs. The radial connector 682 of the radial connection extends from the first leg 632 to the second leg 636, and may be substantially parallel to the planes defined by the turns. A second end of the third turn 620 is operatively coupled to a first end of a second connector 644. A second end of the second connector 644 is operatively coupled to a first end of a fourth turn 622. A second end of the fourth turn 622 is operatively coupled to the output lead 626. A current may flow from the input lead 624 through the first turn 616, through the first connector 640, through the second turn 618, through the first leg 632 of the radial connection, through the second leg 636 of the radial connection, through the third turn 620, through the second connector 644, through the fourth turn 622, and to the output lead 626. This current flow is indicated by the arrows. Accordingly, RF current is made to flow through multi-turn antenna 602 by applying an RF voltage between the input lead 624 and the output lead 626.

Still referring to FIGS. 5 & 6, fourth turn 622 has a larger diameter than first turn 616, and third turn 620 has a larger diameter than second turn 618. Although the outer turns (e.g., third and fourth turns), have larger diameters they are preferably disposed proximate to the inner turns (e.g., first and second turns). That is, the fourth turn 622 is preferably arranged to be proximate to the first turn 616, and the third turn 620 is preferably arranged to be proximate to the second turn 618. As a result of their close proximity, the multi-turn antenna looks and acts like a single turn antenna (e.g., substantially no space between turns). Accordingly, the high or low current areas in the radial direction are substantially reduced. To generalize to other antenna shapes such as oval shape, circular shape, and square shape antennas, the third and fourth turns have larger widths (diameters) than the first and second turns. When the first turn is within the fourth turn, the first turn is closer to the antenna axis than the fourth turn in all azimuthal directions.

Instead of using a bridge 414 with radial legs 416 adjacent to the gaps an in the plane or between the planes of the turns, the antenna of FIGS. 5 & 6 provide radial connectors between the turns a large distance away from the window 212. Distance d1 is the distance between the farthest part of the turns 616, 618, 620, 622 of the multi-turn antenna 602 and the plasma side of window 212. Distance d2 is the distance between the radial connector 682 of the radial connection and the plasma side of window 212. The large distance between the window and the radial connector 682 of the radial connection means that the distance between the window and the radial connector 682 d2 is at least three times the distance between the window and the farthest part of the turns of the antenna d1. More preferably, the distance between the window and the radial connector 682 of the radial connection is as far away as feasible. Improvements in uniformity following this invention are achieved with any increase in the distance between the azimuthally asymmetric radial segments and just below the window although increases at least on the order of the smallest of the width of the window or width of the antenna are needed to make significant improvements. In an example of this embodiment, the large distance is at least 4 inches. To provide such large distances, the bridging of the gaps may not provide the same correction of the azimuthal asymmetry than using a bridge with radial legs, but it has been found that azimuthal asymmetries caused by small radial currents may cause more non-uniformity in wafer processing than azimuthal asymmetries caused by deviations in azimuthal currents. In addition, the radial connector 682 is preferably placed parallel and proximate to a radial line 680 of the output lead 626, so that the currents flow anti-parallel to further reduce the azimuthal asymmetry caused by radial currents.

As is well known to those skilled in the art, a small space between two conductors will typically create arcing between the two conductors. Therefore, the space between the outer and inner turns is limited by a distance that eliminates arcing. However, in one implementation of the present invention, the space is filled with a dielectric material to allow the inner and outer turns to be disposed as close as possible to one another, while substantially eliminating arcing between the inner and outer turns. By way of example, Teflon or ceramic materials having a space between about 0.2 to about 1 cm. work well.

Furthermore, the multi-turn antenna is generally formed from copper. In one implementation, the multi-turn antenna is formed from copper coated with silver. However, it should be noted that the multi-turn antenna is not limited by copper or copper coated with silver and that any suitable conductive metal may be used. In one embodiment, the cross section of the antenna loop is rectangular to facilitate a repeatable location of each loop with respect to the window and each other loop. However, it should be noted that the this is not a limitation and that other cross sectional shapes and sizes may be used. Alternatively, the antenna loop may be formed from a hollow conductor to facilitate temperature control (i.e., flowing a fluid there through).

With respect to the overall size of the multi-turn antenna, i.e., the outer diameter, it is generally preferable (but not absolutely necessary) to size the antenna to be smaller than the cross-section of the process chamber in order to keep the plasma concentrated in the region above the substrate and to prevent undue plasma diffusion to the chamber walls, which disadvantageously requires more power to operate the plasma processing system and increases wall erosion. Furthermore, the size of the plasma to be generated generally corresponds to the size of the antenna used, and therefore, the multi-turn antenna should have an outer diameter that is substantially similar to the diameter of the substrate in order to produce a uniform etch rate. By way of example, the size of the substrates are typically between about 6 to about 12 inches, and therefore in one embodiment, the multi-turn antenna has an outer diameter between about 6 to about 12 inches.

To elaborate further, because of the increased current capacity, i.e., multi-turn antenna that acts like a single turn, the multi-turn antenna may be configured to be smaller than the substrate. That is, the higher concentration of current tends to produce a plasma that is large enough to process the substrate. It should be understood however that the use of smaller antennas may not be required for all processes, i.e., an antenna may be configured to be larger than the substrate. However, if a high degree of uniformity is critical, the use of smaller antennas can be quite beneficial. By way of example, the diameter of the antenna may be configured to be between about 6 to about 15 inches, and preferably between about 7 to about 11 inches, in order to process a 12 inch substrate. It should be noted, however, that this is not a limitation and that the actual size of the antenna may vary according to the specific size of the substrate (e.g., the antenna size may be scaled as needed when smaller or larger substrates are involved) and the specific design of each plasma processing system.

With respect to the RF frequency employed, as a general guideline, a lower RF frequency (e.g., less than 13 MHz) tends to decrease the effects of the transmission line characteristics of the power coupling by reducing standing wave effects. That is, a lower frequency tends to make any inherent azimuthally asymmetric coupling characteristic of an antenna less pronounced. Furthermore, at a lower RF frequency, the capacitive coupling between the antenna and the plasma is also less pronounced, and therefore ion bombardment of the coupling window is reduced. Therefore, the frequency of the RF power source is generally configured to be less than or equal to about 13 MHz, preferably between about 0.4 MHz and about 13 MHz, and more preferably, at about 4 MHz. It should be understood that the use of lower frequencies may not be required for all processes. However, if a high degree of uniformity is critical, the use of low frequencies can be quite beneficial.

As can be seen from the foregoing, the advantages of the first aspect of the invention are numerous. Different embodiments or implementations may have one or more of the following advantages. One advantage of the invention is that an azimuthally symmetric plasma is produced inside the process chamber. As a result, increased process uniformity is achieved, which increases substrate throughput, reduces device failure, and increases the overall productivity of the substrates being processed. Another advantage of the invention is that the inventive antenna arrangement is self shielding, and therefore the capacitive coupling between the antenna and the plasma is reduced. Correspondingly, the ion bombardment of the coupling window is reduced, and therefore the life of the coupling window is increased, and particle contamination associated with ion bombardment is reduced.

Figure 7:
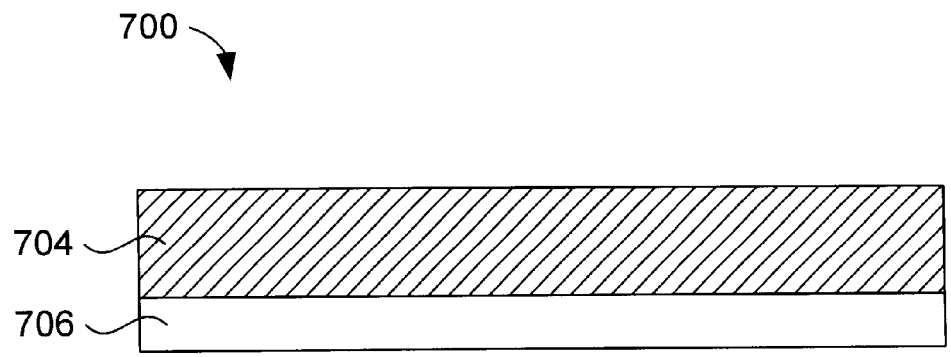
FIG. 7 is a cross sectional side view of the multi-layered coupling window, in accordance with one embodiment of the present invention.

According to an embodiment of the invention, a plasma processing apparatus is provided with a multi-layered coupling window arrangement to substantially reduce capacitive coupling between the antenna and the plasma. To facilitate discussion, FIG. 7 illustrates a multi-layered coupling window arrangement 700, in accordance with one embodiment of the present invention. The multi-layered coupling window arrangement 700 may respectively correspond to the coupling window 212 illustrated in FIG. 2. Multi-layered coupling window 700 includes at least a first layer 704 and a second layer 706. Preferably, first layer 704 is bonded to second layer 706. In one implementation, the two layers are thermally bonded together. However, it should be noted that a this is not a limitation and that other bonding processes may be used. Alternatively, it should be noted that a gap may be disposed between the layers, i.e., a vacuum gap or a gap to allow gas flow between the layers, while still obtaining the benefits described. Furthermore, second layer 706 preferably forms part of the inner peripheral surface of the process chamber.

Referring first to the second layer, the second layer is configured to act as an electrostatic shield that reduces the potential difference on its surface. Further, the second layer is arranged to be electrically isolated and preferably formed from a conducting or semi-conducting material that can facilitate the passage of inductive RF energy from the antenna to the plasma. Additionally, because the second layer is exposed to the plasma inside the process chamber, the second layer is preferably formed from a material that is substantially resistant to a plasma. In a preferred embodiment, the second layer is formed from Silicon Carbide (SiC). For the most part, SiC can resist the thermal, chemical and physical effects of plasma processing. In addition, SiC is generally classified as a dielectric, yet yields some resistance to the flow of current. The resistive property is what produces the shielding effect, and the dielectric property is what allows inductive coupling.

The resistivity of the second layer is an important parameter for ensuring that the layer act as an electrostatic shield, while not impacting the inductive electric field. For the most part, the particular resistivity range to be used in the invention depends on the exact dimensions of the antenna with which the coupling window is being used, the operating frequency of the power coupling and the thickness of the second layer. By way of example, a resistivity from about 100 ohm-cm to about 10 kohm-cm works well. However, it should be understood that if desired, the resistivity can be configured to be greater than $10^6$ ohm-cm to make the second layer (e.g., SiC) act more like a dielectric layer.

While not wishing to be bound by theory, it is believed that the electrical resistance of the second layer presents an equipotential surface to the process gas used to form the plasma. For example, after ignition of the plasma, the potential on the second layer is substantially reduced due to the proximity of the plasma to the second layer. Furthermore, a capacitive voltage divider is generally formed, for example, an upper part, which is formed by the dielectric first layer having a constant capacitance, and a lower part, which is formed by the conductive second layer and the chamber walls before ignition and the conductive second layer and the plasma after ignition. Before ignition the lower part has a small capacitance, and therefore there is a large voltage aiding ignition (e.g., in order to initiate the discharge, a capacitive electric field is typically necessary). After ignition the lower part has a large capacitance such that the voltage is substantially reduced, and therefore it does not lead to significant capacitive power coupling.

Referring now to the first layer, the first layer is preferably formed from a dielectric material that can facilitate the passage of inductive RF energy from the antenna to the plasma. Further, the first layer is configured to be strong enough to structurally hold vacuum and robust enough to be easily handled during periodic cleaning of the chamber. Additionally, the first layer is generally formed from a dielectric material that has superior thermal properties to enable temperature control of the window. By way of example, dielectric materials formed from Silicon Nitride (SiN) or Aluminum Nitride (AlN) work well. However, it should be understood that this is not a limitation and that other materials may be used. For example, alumina and quartz may also work well.

The overall thickness of the multi-layer coupling window 700 is configured to be thin enough to effectively transmit the antenna RF energy to the plasma, while being sufficient to withstand the pressures and heat that are generated during processing. Preferably, the thickness of the multi-layer coupling window is between about 0.5 and about 1 inch. Further, the first layer 704 should have a thickness greater than the second layer 706. Preferably, the thickness of the first layer is between about 0.5 and about 1 inches. Furthermore, the thickness of the second layer is preferably between about 0.1 and about 0.5 inches. It should be understood that the actual thickness of layers may vary according the specific material chosen for each layer.

Note that there is no requirement that the size of the coupling window be equal to the size of the plasma processing chamber. In general, however, a small coupling window may reduce cost, particular when expensive materials such as SiC are employed. In one embodiment, the shape of the window coupling is configured to coincide with the shape of the antenna arrangement, and therefore, the coupling window is configured to be substantially circular. In another embodiment, the outer dimensions of the coupling window may be configured to extend a small distance beyond the outer dimensions of the antenna, in order to reduce any coupling to electrically conductive elements which may encircle the antenna. In one example, the outer dimensions of the coupling window is arranged to extend about 1 inch past the outer dimensions of the antenna. In yet another embodiment, the coupling window may have a shape that is substantially the same as the antenna, i.e., hoop shaped.

With respect to the dielectric properties (e.g., dielectric constant) employed, as a general guideline, a lower dielectric constant, e.g., less than about 10 tends to decrease the effects of the transmission line characteristics of the power coupling by reducing standing wave effects. More specifically, a lower dielectric constant tends to make the wavelength of the transmitted energy longer, which makes the antenna look shorter and therefore fewer nodes are created in the standing wave pattern. Accordingly, a lower dielectric constant tends to make any inherent azimuthally asymmetric coupling characteristic of an antenna less pronounced.

Furthermore, it is contemplated that additional elements may be employed, along with the aforementioned multi-turn antenna and multi-layered coupling window, to further enhance the uniform processing of a substrate in a plasma processing system. By way of example, a magnetic arrangement can be arranged with the multi-turn antenna to control the radial variation of the static magnetic field within the process chamber in the region proximate the coupling window and the multi-turn antenna. An example of such an magnetic arrangement may be found in co-pending patent application entitled, "IMPROVED PLASMA PROCESSING SYSTEMS AND METHODS THEREFOR". U.S. Pat. No. 6,341,574, issued on Jan. 29, 2002 and incorporated herein by reference.

Figure 8:
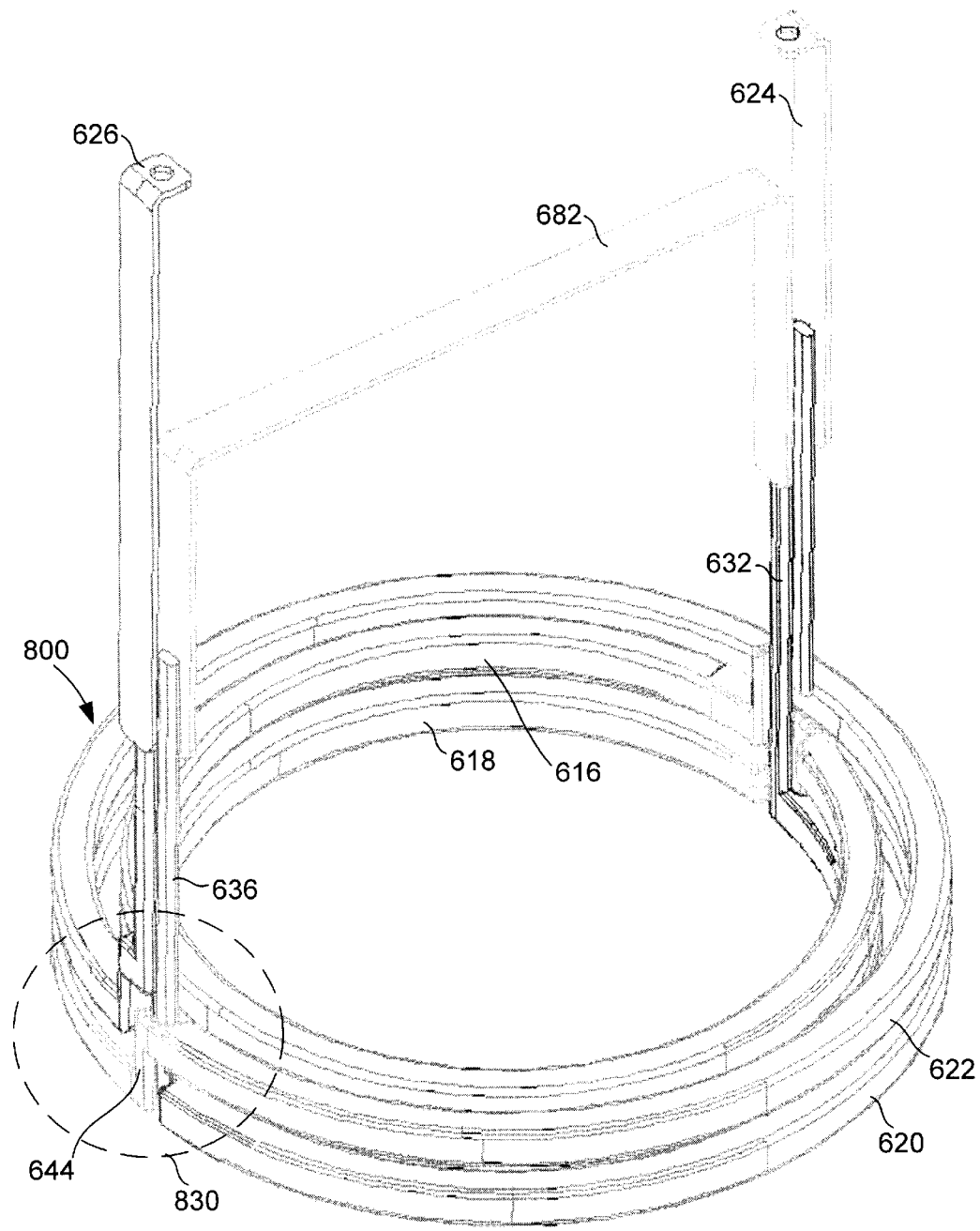
FIG. 8 is perspective view of a multi-turn antenna of an embodiment of the invention.
Figure 9:
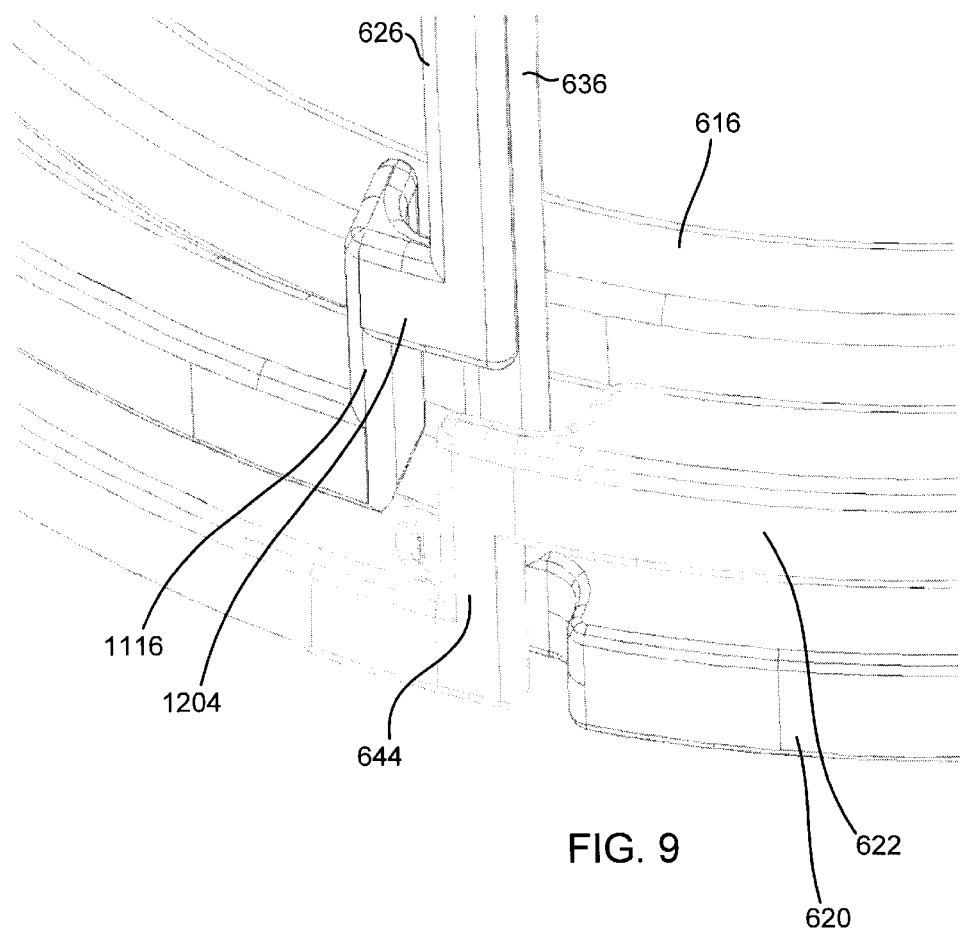
FIG. 9 is an enlarged section of the multi-turn antenna of FIG. 8.

FIG. 8 is a perspective view of a multi-turn antenna 800 provided by an embodiment of the invention. Since the multi-turn antenna 800 of FIG. 8, may be an implementation of the schematic illustration of FIG. 6, the same numbering is used for the same parts. The multi-turn antenna 800 comprises a first turn 616, a second turn 618, a third turn 620, and a fourth turn 622. Each turn defines a plane, which passes through the circumference of the turns. These planes are either substantially parallel or coplanar to each other. An input bus 624 is connected to a first end of the first turn 616. A second end of the first turn 616 is connected to a first end of a first connector 640. A second end of the first connector is connected to a first end of the second turn 618. A part of the first connector that spans between the first turn 616 and the second turn 618 is substantially perpendicular to the planes defined by the first turn 616 and second turn 618. A second end of the second turn 618 is connected to the first leg 632 of the radial connection. The second leg 636 of the radial connection is connected to a first end of the third turn 620. The first leg 632 and the second leg 636 are substantially perpendicular to the planes defined by the turns 616, 618, 620, 622. The radial connector 682 of the radial connection extends from the first leg 632 to the second leg 636, and may have a length that is substantially parallel to the planes defined by the turns. The second end of the third turn 620 is connected to a first end of a second connector 644. The second end of the second connector 644 is connected to the first end of the fourth turn 622. A part of the second connector 644 that spans between the third turn 620 and the fourth turn 622 is substantially perpendicular to the planes defined by the third turn 620 and fourth turn 622. The second end of the fourth turn 622 is connected to the output bus 626. FIG. 9 is an enlarged schematic top view of cut out section 830 of FIG. 9, which shows a section of the third turn 620, the fourth turn 622, the second leg 636, the second connector 644, and the output bus 626. Because, the planes defined by the turns 616, 618, 620, 622 are horizontal, the lengths of the first leg 632, the second leg 636, the first connector 640, and the second connector 644 are substantially vertical, while the radial connector of the radial connection is substantially horizontal.

Figure 10:
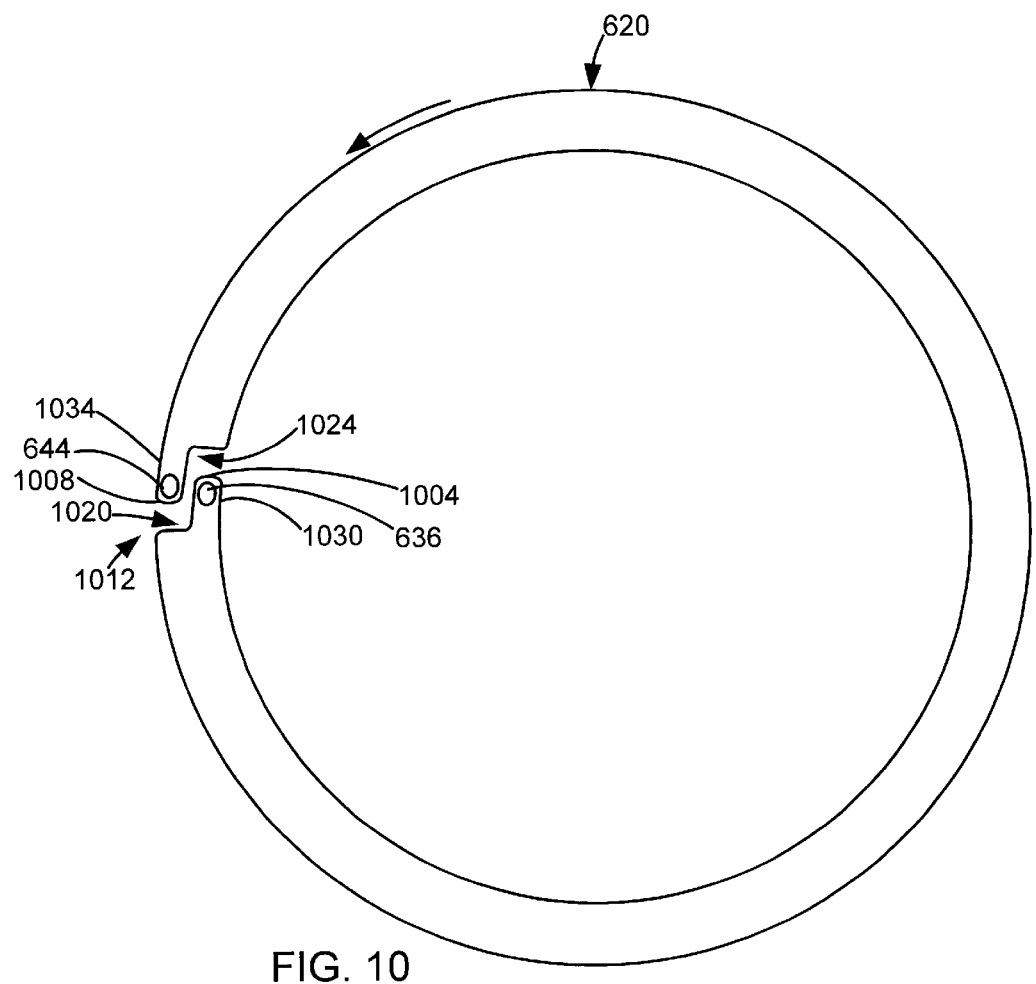
FIG. 10 is a top view of a third turn.

FIG. 10 is a top view of the third turn 620. The third turn 620 has a first end 1004 and a second end 1008, where the first end 1004 and the second end 1008 of the third turn 620 are separated by a third turn gap 1012. The second leg 636 of the radial connection is connected to the first end 1004 of the third turn 620. The second connector 644 is connected to the second end 1008 of the third turn 620. Both the first end 1004 and the second end 1008 of the third turn 620 form notches 1020, 1024. A first notch 1020 forms a narrowed cantilever portion 1030 of the first end 1004. The second notch 1024 forms a narrowed cantilever portion 1034 of the second end 1008. The notches 1020, 1024 and the narrowed cantilever portions 1030, 1034 allow the narrowed cantilever portions 1030, 1034 to lie along the same radial direction, which allows the second connector 644 and second leg 636 to lie along the same radial direction of the turn, which may form a substantially complete turn. A complete notched turn is a turn as shown in FIG. 10, that has a notched first end and second end to form cantilever portions, where parts of the cantilever portions of the first end and second end lie along the same radial direction, so that an electrical connector connected to the first end lies along a common radius passing through the antenna axis as a second electrical connector connected to the second end.

Figure 11:
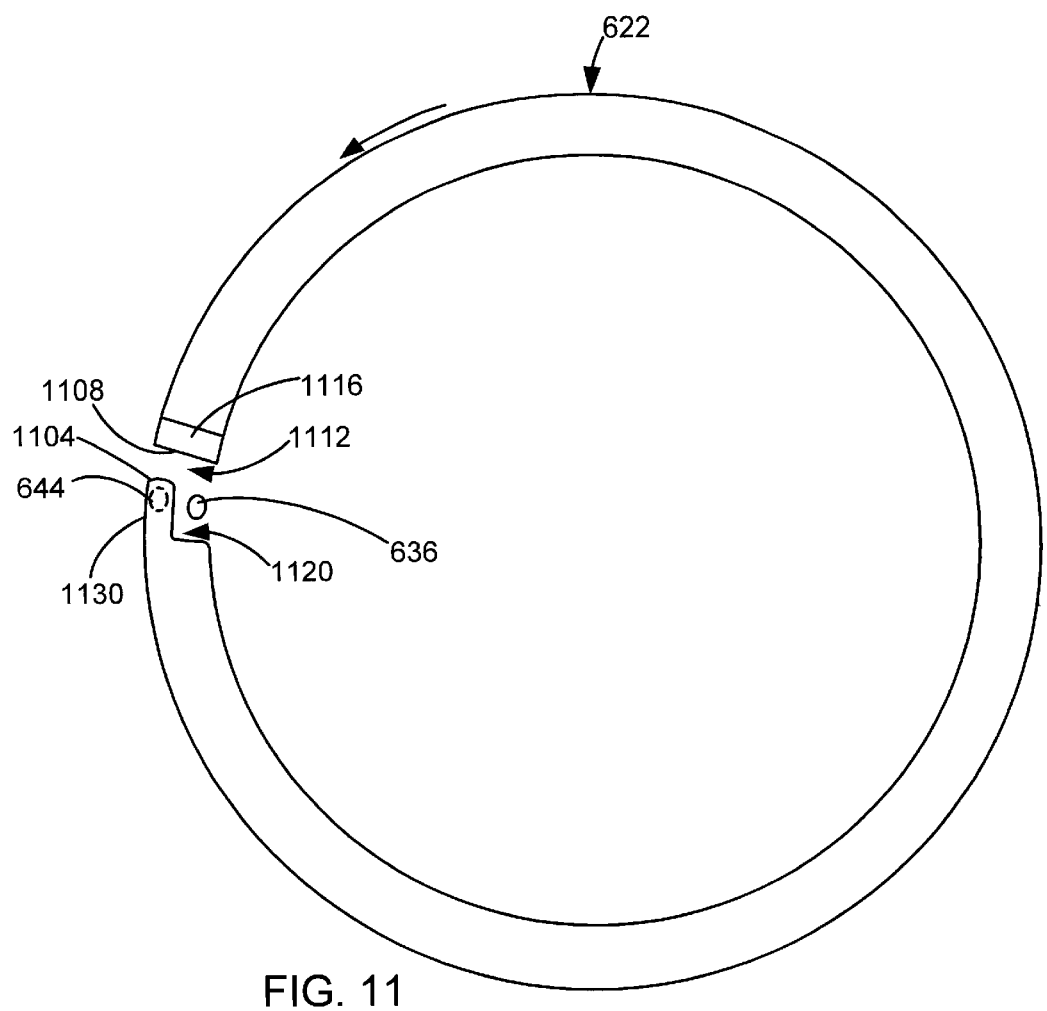
FIG. 11 is top view of a fourth turn.

FIG. 11 is a top view of the fourth turn 622. The fourth turn 622 has a first end 1104 and a second end 1108, which are separated by a gap 1112. The second connector 644 is connected to the bottom side of the first end 1104. A third connector 1116 is connected to the second end 1108 of the fourth turn 622. A notch 1120 is formed in the first end 1104 of the fourth turn 622 to form a narrowed cantilever portion 1130 of the first end 1104. The notch 1120 provides a space for the second leg 636 of the radial connection to pass without shorting. Since a space is provided for the second leg 636, the first end 1104 and the second end 1108 do not overlap along a radius. Instead, the fourth turn 622 is incomplete.

Figure 12:
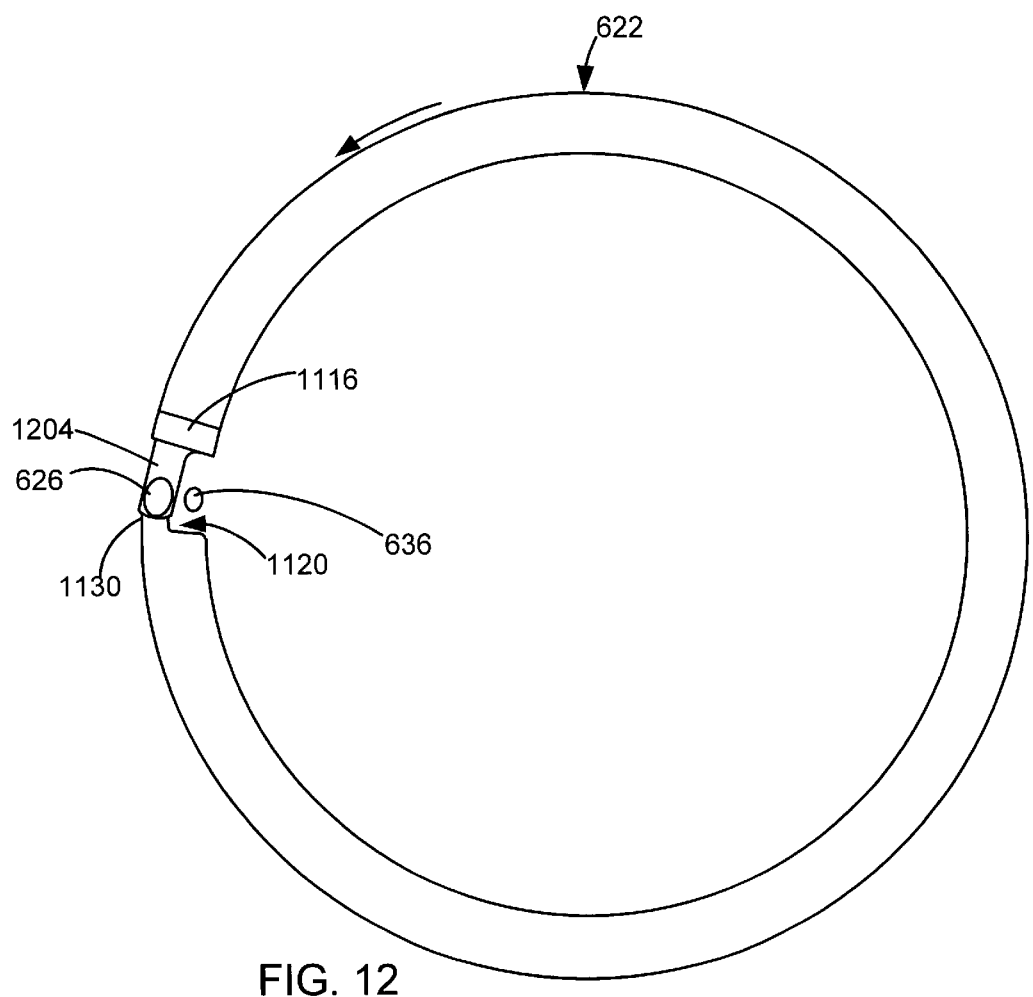
FIG. 12 is a top view of an upper connector above the fourth turn.

FIG. 12 is a top view of a upper connector 1204 above the fourth turn 622. The upper connector 1204 has a first end connected to the third connector 1116 and a second end connected to the output lead 626. As shown in FIG. 9, the third connector 1116 extends from the fourth turn 622 up to the upper connector 1204, and the upper connector 1204 extends above the first end of the fourth turn 622, so that the fourth turn 622 and the upper connector 1204 make a substantially complete turn. If the gap in the fourth turn was compensated by a bridge in the plane of the fourth turn 622 and at a different radial length than the radius of the fourth turn, a radial component would be needed to connect the bridge to the fourth turn, causing radial currents that cause azimuthal asymmetries. Instead, the upper connector 1204 bridges the gap along the same radial length as the fourth turn 622, but above the fourth turn 622.

Figure 13:
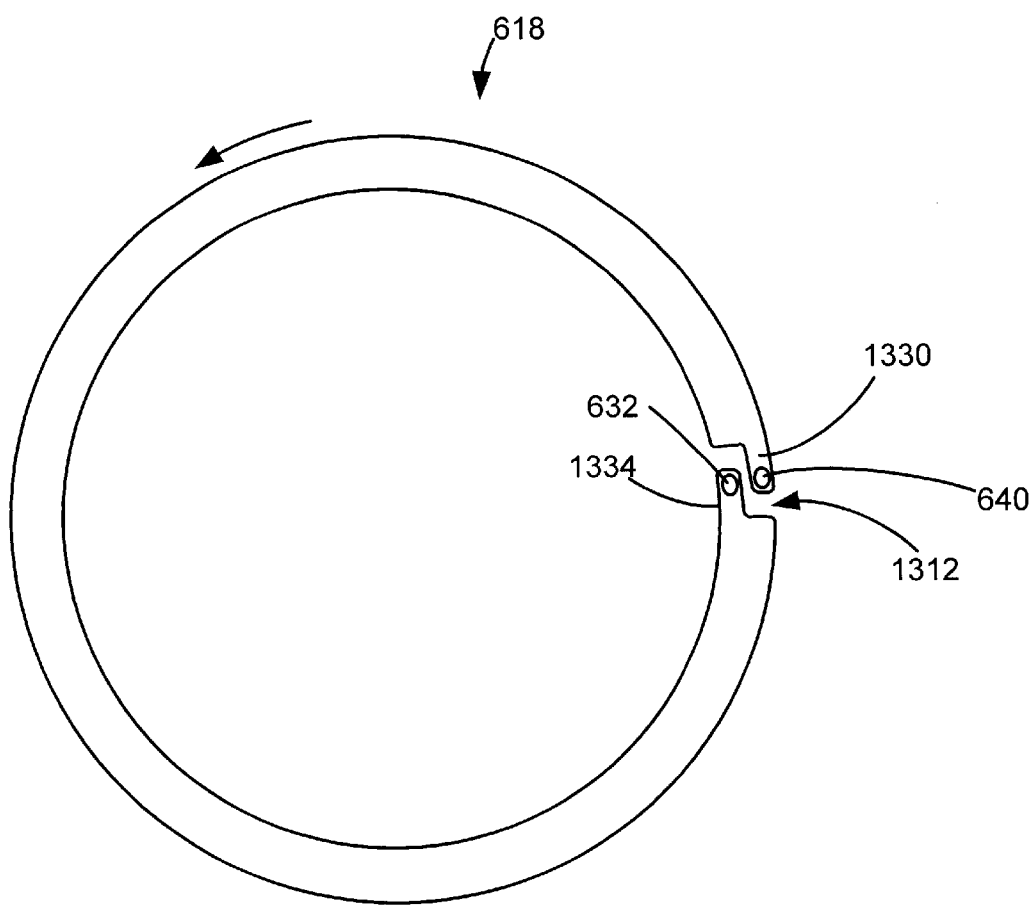
FIG. 13 is a top view of a second turn.

FIG. 13 is a top view of the second turn 618. The second turn 618 has a first end and a second end, where the first end and the second end of the second turn 618 are separated by a second turn gap 1312. The first connector 640 is connected to the first end of the second turn 618. The first leg 632 of the radial connection is connected to the second end of the second turn 618. Both the first end and the second end of the second turn 618 form notches. A first notch forms a narrowed cantilever portion 1330 of the first end. The second notch forms a narrowed cantilever portion 1334 of the second end. The notches and the narrowed cantilever portions 1330, 1334 allow the narrowed cantilever portions 1330, 1334 to lie along the same radial direction, which allows the first connector 640 and first leg 632 to lie along the same radial direction, which may form a substantially complete turn.

Figure 14:
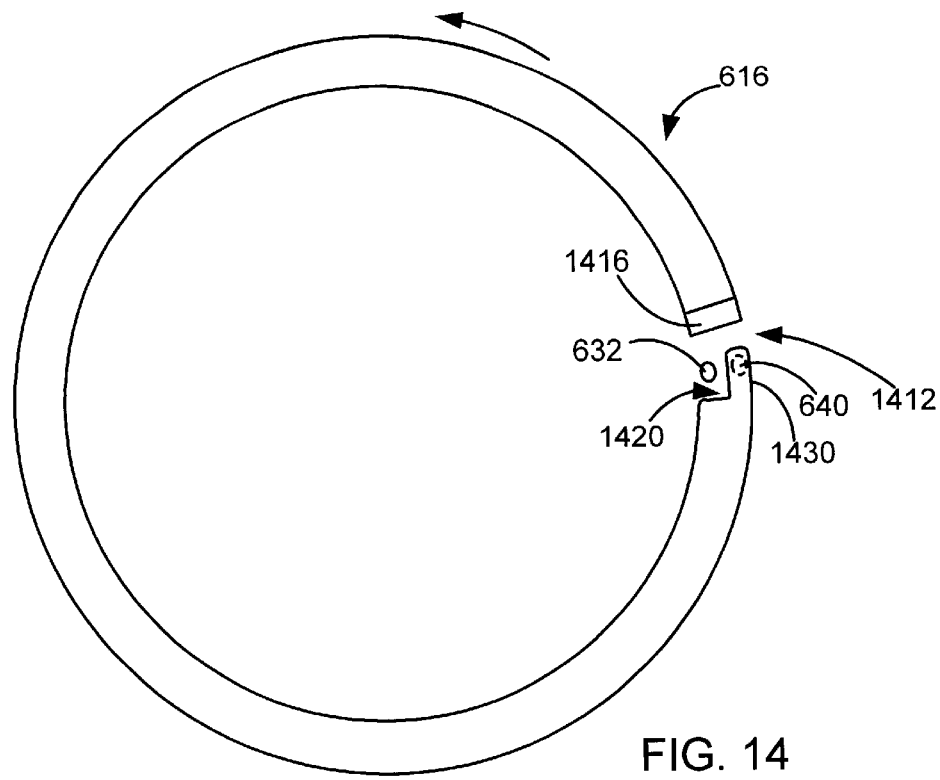
FIG. 14 is a top view of a first turn.

FIG. 14 is a top view of the first turn 616. The first turn 616 has a first end and a second end, which are separated by a gap 1412. The first connector 640 is connected to the bottom side of the first end. A fourth connector 1416 is connected to the second end of the first turn 616. A notch 1420 is formed in the first end of the first turn 616 to form a narrowed cantilever portion 1430 of the first end. The notch 1420 provides a space for the first leg 632 of the radial connection to pass without shorting. Since a space is provided for the first leg 636, the first end and the second end do not overlap along a radial direction. Instead, the first turn 616 is incomplete.

Figure 15:
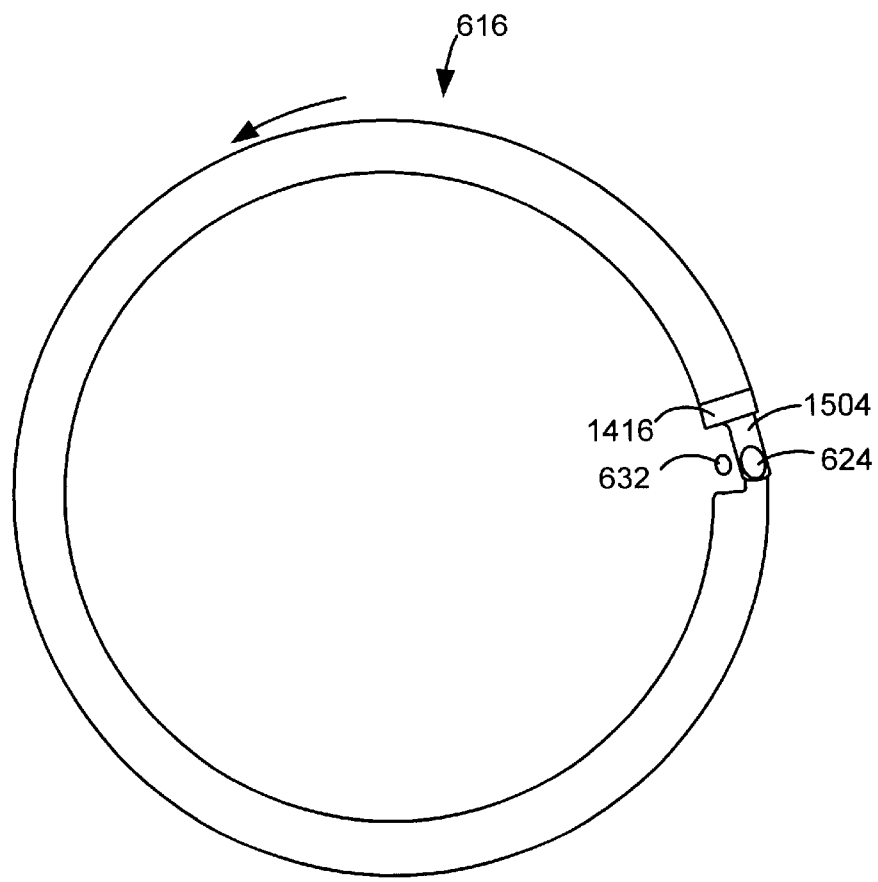
FIG. 15 is a top view of a second upper connector above the first turn.

FIG. 15 is a top view of a second upper connector 1504 above the first turn 616. The second upper connector 1504 has a first end connected to the fourth connector 1416 and a second end connected to the input lead 624. The fourth connector 1416 extends from the first turn 616 up to the second upper connector 1504, and the second upper connector 1504 extends above the first end of the first turn 616, so that the first turn 616 and the second upper connector 1504 make a substantially complete turn. If the gap in the first turn was compensated by a bridge in the plane of the first turn 616 and at a different radial length than the radius of the first turn, a radial component would be needed to connect the bridge to the first turn, causing radial currents, which may cause azimuthal asymmetries. Instead, the second upper connector 1504 bridges the gap along the same radial length as the first turn 616, but above the first turn 616.

Figure 16:
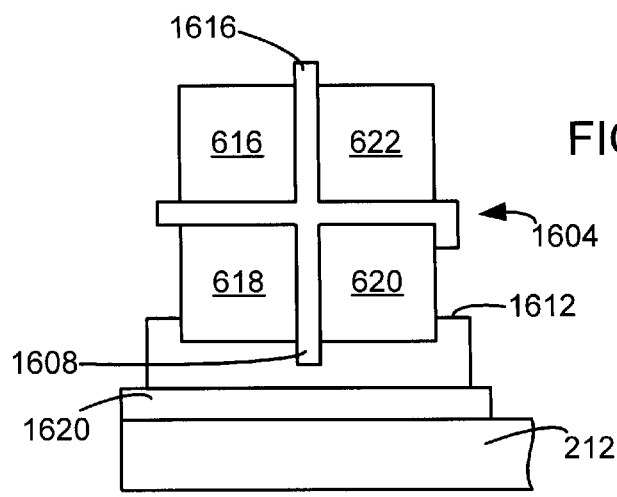

As mentioned above, a dielectric material may be placed between the turns 616, 618, 620, 622 to allow the turns to be disposed as close as possible to one another, while substantially eliminating arcing between the inner and outer turns. FIG. 16 is a cross-sectional view of the turns 616, 618, 620, 622 with such insulation disposed there between. The first, second, third, and fourth turns 616, 618, 620, 622 are mounted around a central insulator 1604 to form an assembly, as shown. The central insulator forms a bottom ridge ring 1608. The assembly is placed on a bottom insulator 1612. The bottom ridge ring 1608 of the central insulator 1604 is mounted into a central groove of the bottom insulator 1612. A top ridge ring 1616 extends above the first turn 616 and fourth turn 622 so that distance along the surface of the top ridge ring 1616 from the first turn 616 to the fourth turn 622 is greater than the minimum surface distance required to prevent arcing. The bottom insulator 1612 may be placed on a faraday shield 1620, which may be placed on the dielectric window 212.

Figure 19:
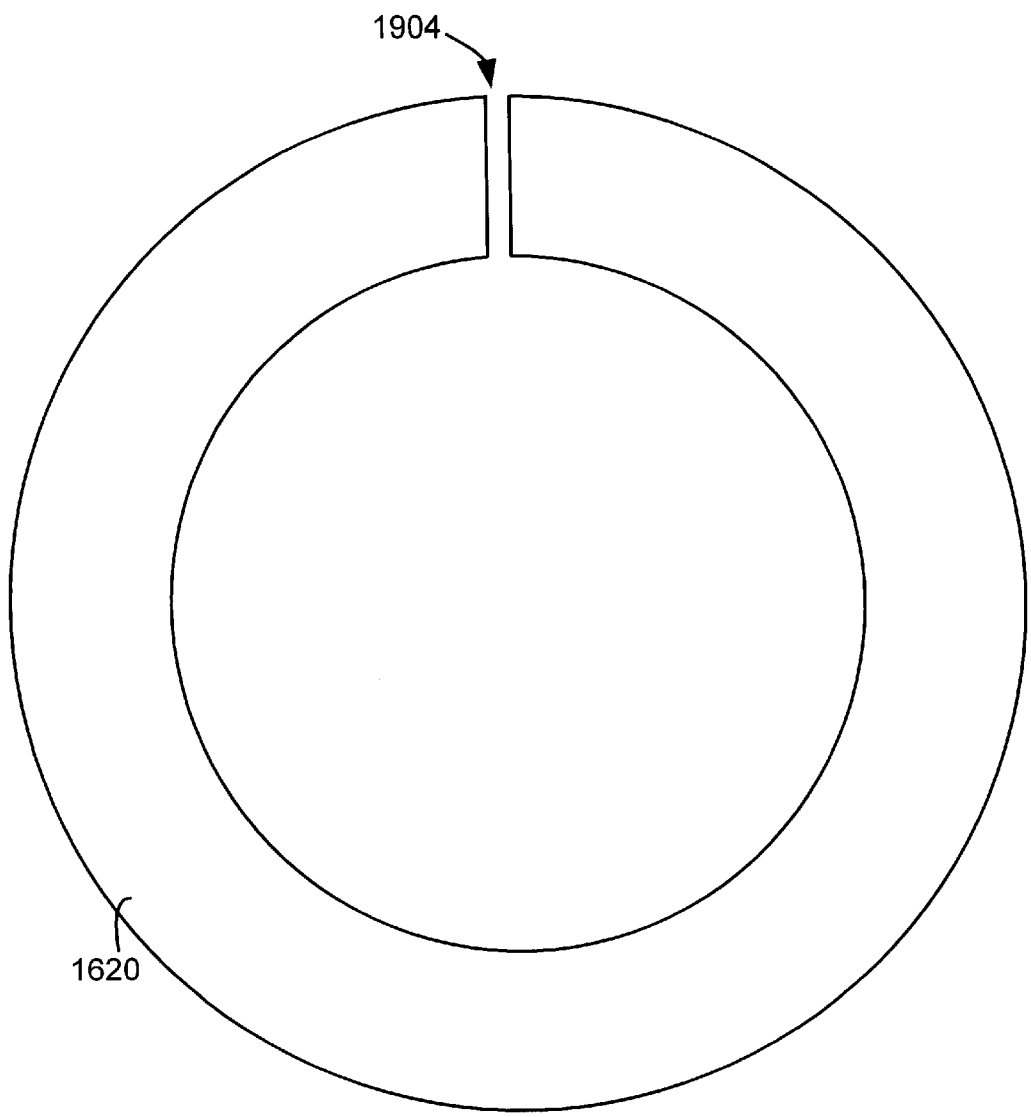
FIG. 19 is a top view of a faraday shield.

FIG. 19 is a top view of the faraday shield 1620. The faraday shield 1620 may be provided to further minimize azimuthal variations in coupling and to control the extent of capacitive coupling. This may be implemented by either grounding the faraday shield 1620, applying a specified voltage to the faraday shield or allowing the faraday shield to float. Since the antenna footprint is in the shape of a ring, the faraday shield 1620 may be in a ring shape that matches the footprint of the antenna. In the preferred embodiment, the faraday shield 1620 is a ring shape conductive material that is slightly larger than the footprint of the antenna and with at least one radial slot 1904 across part of the ring. In other preferred embodiments more than one slot is provided.

In an example in this embodiment, the turns 616, 618, 620, 622 are about 1 cm thick. The central insulator 1604 spaces the turns a distance 616, 618, 620, 622 a distance of about 0.5 cm apart. The faraday shield has a thickness of about 0.15 cm. Therefore the distance between the top of the dielectric window 212 and the farthest part of the turns, which is the top of the first or fourth turn 616, 622 is about 3 cm. Therefore in this embodiment, it is desirable to place the radial connector 682 greater than three times the distance from the dielectric window 212 to the farthest part of the turns, which is 9 cm.

At least in the area the first leg 632 is close (not far from) to the window, the first leg 632 is substantially perpendicular to the planes defined by the turns and is placed close to the input lead 624 and the first connector 640, to minimize asymmetries caused by the first leg 632, input lead 624, and first connector 640. The first connector 640 and input lead 624 provided canceling magnetic fields long substantially the entire length of the first leg 632. At least in the area the second leg is close to the window, the second leg 636 is substantially perpendicular to the planes defined by the turns and is placed close to the output lead 626 and the second connector 644, to minimize asymmetries caused by the second leg 636, output lead 626, and second connector 644.

By placing connection concentrations at different azimuthal locations, such as being on opposite sides of the loop, non-azimuthal perturbations created by the connection imperfections are separated, which improves azimuthal uniformity. By placing such connections on opposite sides of the turns residual dipoles, caused by the connections, may be made to oppose each other. Although the residual dipoles, caused by the connections, are placed on opposite sides of the turns, this embodiment causes them to oppose each other, instead of having them at the same side of the turns and having them in the same direction.

The inventive antenna has been found to provide an approximately 2–3 fold decrease in the measured azimuthal asymmetry in wafer results.

Figure 17:
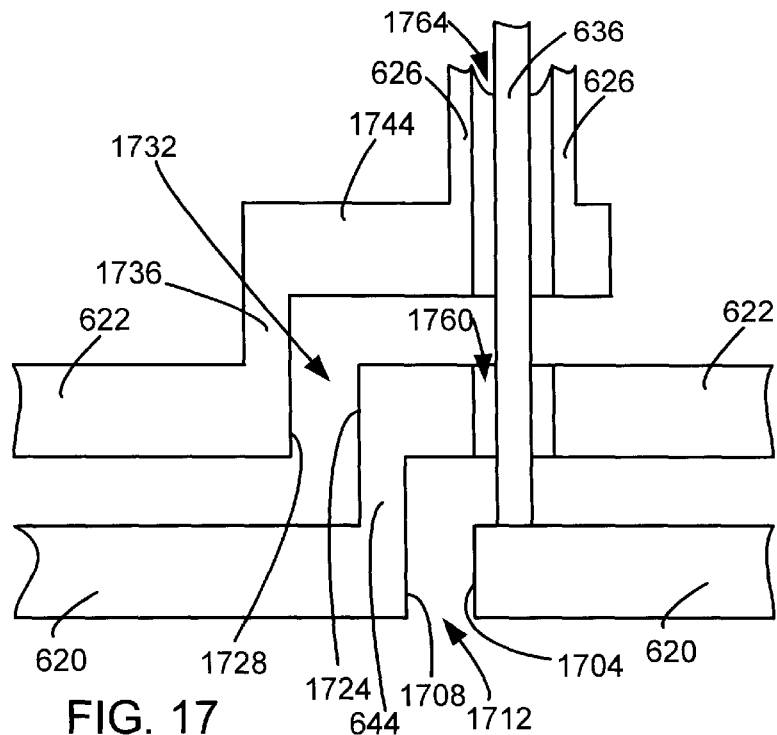
FIG. 17 is a cross sectional view of part of a third turn and fourth turn used in another embodiment of the invention.

FIG. 17 is a cross sectional view of part of a third turn 620 and fourth turn 622 used in another embodiment of the invention. The third turn 620 has a first end 1704 and a second end 1708, where the first end 1704 and the second end 1708 of the third turn 620 are separated by a third turn gap 1712. The second leg 636 of the radial connection is connected to the first end 1704 of the third turn 620. The second connector 644 is connected to the second end 1708 of the third turn 620. The gap 1712 causes the third turn 620 to form an incomplete loop.

The fourth turn 622 has a first end 1724 and a second end 1728, which are separated by a gap 1732. The second connector 644 is connected to the first end 1724 of the fourth turn 622. A third connector 1736 is connected to the second end 1728 of the fourth turn 622. The gap 1732 causes the fourth turn 622 to form an incomplete loop.

An upper connector 1744 has a first end connected to the third connector 1736 and a second end connected to the output lead 626. The third connector 1736 extends from the fourth turn 622 up to the upper connector 1744, and the upper connector 1744 extends above the first end of the fourth turn 622, so that the upper connector 1744 bridges the gaps 1712, 1732. This results in the upper connector 1744, the third turn 620, and the fourth turn 622 forming two substantially complete turns.

In this embodiment, instead of using notches to allow connectors, such as the second leg 636 to pass by the fourth turn 622, the second leg 636, passes through the fourth turn 622, the upper connector 1744, and the output lead 626. A hole 1760 is placed through the fourth turn 622, and a hole 1764 is placed through the second leg 636 and the upper connector 1744 to provide sufficient space for the second leg 636 to pass through without arching. An insulator may be placed around the second leg 636 in the holes to further prevent arching. Although the gaps in each turn are not bridged in the same plane as the turn, radial connectors have been moved a large distance from the window. The azimuthal asymmetry created by bridging the gaps at the same radial distance as the turn instead of in the same plane as the turn is not as great as azimuthal asymmetry from radial currents that results if radial connectors were placed near the window.

By making second leg 636 coaxial with the output lead 626 the magnetic fields from the second leg 636 and output lead 626 are able to better cancel each other. In addition, the second connector 644 is placed close to the second leg 636 to provide further canceling.

Figure 18:
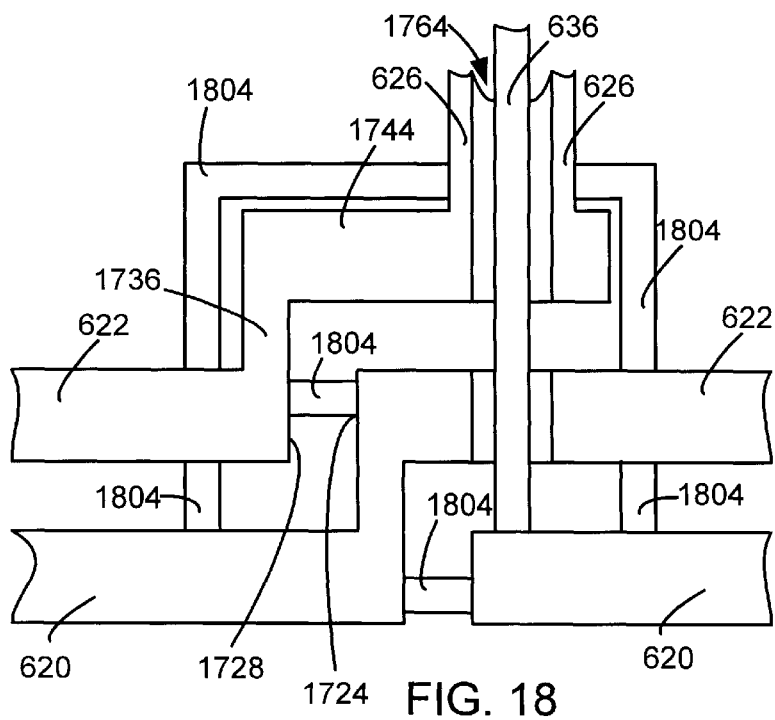
FIG. 18 is a view of the device shown in FIG. 17 with a passive antenna.

FIG. 18 is a cross-sectional view of the device shown in FIG. 17, where a passive antenna 1804 is placed adjacent to the third turn 620 and fourth turn 622. Such passive antennas are is discussed in U.S. patent application Ser. No. 10/200, 833, entitled "Methods and Apparatus For Producing Uniform Processing Rates", by Howald et al., filed on Sep. 22, 2002, and incorporated herein by reference for all purposes. The passive antenna 1804 may be used to reduce the azimuthal asymmetries. This pass through design allows for a clear design of the passive antenna, which helps to redirect current back to the desired azimuthal current path.

In the previous embodiments with first, second, third, and fourth turns 616, 618, 620, 622, the first and second turns 616, 618 may be considered an inner loop and the third and fourth turns 620, 622 may be considered an outer loop, with the legs and radial connector, connecting the inner loop with the outer loop. In these embodiments, the inner loop is concentric with the outer loop, where the outer loop has a larger diameter than the inner loop.

Although in previous embodiments, the antenna is formed from a first loop and a second loop, where the first loop and second loops are of the same geometry and are co-axial and where one loop is placed over the other loop, other types of antenna arrangements may be used. Such other arrangements may use two single loops or may provide that the second loop is of a different geometric shape than the first loop. The loops may have more than two turns. Preferably, the azimuthal gaps in the turns comprising the loops are minimized so that the gaps make a radial angle of less than 3° and so that radii of the ends of the turns adjacent to a gap are the same. In addition, the input and output feeds may be coaxial for part of their lengths as another way of reducing their dipole effect. In this embodiment, the turn gaps are preferably about ⅛ inch. More preferably the turn gaps are compensated by oriented cantilever portions fitting into notches at the same radial distance as described in FIGS. 10 and 13. When such oriented cantilever and notch design are impractical, the present invention prefers following the principle of compensating for gaps in azimuthal current by adding an additional partial antenna turn in a plane substantially parallel to the other turn planes with a length nearly equal to the missing azimuthal gap at the same radial position to form an integer number of substantially complete turns.

Such other arrangements may use two single loop or may provide that the second loop is of a different geometric shape than the first loop. There may be more than two loops. The loops may have one turn. For higher coupling fields the loops preferably have more loop turns. Preferably two loop turns are used so that the partial turn compensating azimuthal current length (see FIG. 12 1204, FIG. 15 1504, FIG. 17 1744) is approximately equal to the azimuthal gap and simultaneously places the two loop leads in proximity for field cancellation. Construction of many loop turns preferably requires even azimuthal spacing of the vertical connecting legs and the associated azimuthal gaps so that approximately an integer number of loop turns is achieved while providing for the loop leads to be in proximity for field cancellation.

In the present invention, with the radial connections between loops far away from the window, improved invented antennas can be constructed with multiple loops made of single or multiple loop turns with azimuthal current compensation at the same radius (see FIGS. 10–11). To make improved azimuthally symmetric fields, the constraint on having the loops in radial proximity is removed. It is better if the individual loops are electrically short compared to the wavelength of the energy transmitted through the antenna. It is preferable that the loops are close together so that the loops have a combined length that is smaller than the wavelength of energy transmitted through the antenna arrangement.

Figure 20:
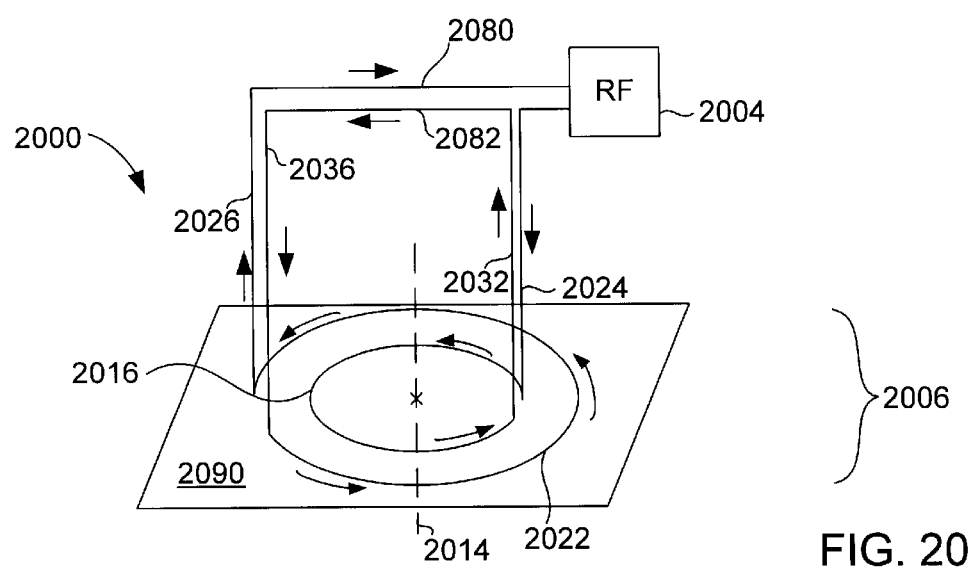
FIG. 20 is a schematic view of another embodiment of the invention.

FIG. 20 is a schematic illustration of an embodiment of a multi-turn antenna arrangement 2000, in accordance to one embodiment of the present invention, where only two turns are provided. The multi-turn antenna arrangement 2000 includes a multi-turn antenna operatively coupled to a RF power source 2004, which, for example, respectively correspond to the antenna 210 and the RF power source 214 illustrated in FIG. 2.

Multi-turn antenna is substantially circular and includes at least a first turn 2016 and a second turn 2022. In this embodiment, an input lead 2024 is operatively coupled to a first end of the first turn 2016. A second end of the first turn 2016 is operatively coupled to a first leg 2032 of the radial connection. A second leg 2036 of the radial connection is operatively coupled to a first end of the second turn 2022. At least close to the window, the first leg 2032 and the second leg 2036 are substantially perpendicular to the diameters of the turns 2016, 2022. The radial connector 2082 of the radial connection extends from the first leg 2032 to the second leg 2036, and may be substantially parallel to a diameter of the turns. A second end of the second turn 2022 is operatively coupled to an output lead 2026. A current may flow from the input lead 2024 through the first turn 2016, through the first leg 2032 of the radial connection, through the second leg 2036 of the radial connection, through the second turn 2022, and to the output lead 2026. This current flow is indicated by the arrows. Accordingly, RF current is made to flow through multi-turn antenna 2006 by applying an RF voltage between the input lead 2024 and the output lead 2026.

Still referring to FIG. 20, the second turn 2022 has a larger diameter than the first turn 2016. Although the outer turns (e.g., second turn), have larger diameters they are preferably disposed proximate to the inner turns (e.g., first). That is, the second turn 2022 is preferably arranged to be proximate to the first turn 2016. As a result of their close proximity, the multi-turn antenna looks and acts like a single turn antenna (e.g., substantially no space between turns). Accordingly, the high or low current areas in the radial direction are substantially reduced.

As in the other embodiments, instead of using a bridge with radial legs adjacent to the gaps, the antenna this embodiment provides radial connectors between the turns a large distance away from the window 212. The large distance between the window and the radial connector 2082 of the radial connection means that the distance between the window and the radial connector 2082 is at least three times the distance between the window and the farthest part of the turns of the antenna. More preferably, the distance between the window and the radial connector 2082 of the radial connection is at least four times the distance between the window and the farthest part of the turns of the antenna. In addition, the radial connector 2082 may be placed parallel and proximate to a radial line 2080 of the output lead 2026, so that the currents flow anti-parallel to further reduce the azimuthal asymmetry caused by radial currents.

In this embodiment, the first turn 2016 has a smaller diameter than the second turn 2022, so that the second turn 2022 is radially set apart from the first turn 2016. In this example the first turn 2016 forms an inner loop and the second turn 2022 forms an outer loop, so that the first turn 2016 is closer to the antenna axis than the second turn 2022 is to the antenna axis in each azimuthal direction. Because the turns have a different diameter, a radial connector must be used to connect the first turn 2016 with the second turn. The radial connector is placed a large distance from the window. Preferably, the first turn defines a first plane in that the first plane passes through the entire circumference of the first turn and the second turn defines a second plane in that the second plane passes through the entire circumference of the second turn, where the first plane and second plane are substantially parallel. The radial connector has a length that is substantially parallel to the planes defined by the first turn and the second turn. More preferably, the first turn and second turn are concentric and coplanar. In the example shown in FIG. 20, the first and second turns are coplanar, so that the first plane and second plane are the same plane 2090. Preferably, an antenna axis 2014 around which the first turn and second turn are disposed is substantially perpendicular to the first plane and second plane. Preferably, the first leg 2032, the second leg 2036, the input lead 2024, and the output lead 2026 near the window are substantially perpendicular to the first and second planes 2090. By placing the input lead 2024 close to the first leg 2032 and making them substantially perpendicular to the plane defined by the turns near the window, azimuthal asymmetries caused by the input lead 2024 and first leg 2032 are minimized.

In other embodiments, the legs, connectors, and leads are only substantially perpendicular to the turns and placed close together for the parts of the legs, connectors, and leads that are close to the turns or windows. The legs, connectors, and leads are not substantially perpendicular or close together far away from the turns or windows. In addition, in other embodiments, the inventive antenna may be used for capacitive coupling plasma chambers and other devices.

While this invention has been described in terms of several preferred embodiments, there are alterations, various modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, various modifications permutations, and substitute equivalents as fall within the true spirit and scope of the present invention.

What is claimed is:

1. An antenna arrangement for generating an electric field inside a process chamber through a window, said antenna arrangement comprising:
    an outer loop, comprising a first outer loop turn disposed around an antenna axis;
    an inner loop, comprising a first inner loop turn disposed around the antenna axis, wherein the inner loop turn is closer to the antenna axis than the first outer loop turn is to the antenna axis in each azimuthal direction; and
    a radial connector radially electrically connecting the outer loop to the inner loop, wherein the radial connector is placed a large distance from the window.

2. The antenna arrangement as recited in claim 1, wherein the first outer loop turn defines a first plane and the first inner loop turn defines a second plane, further comprising a first leg extending from the outer loop and a second leg extending from the inner loop, wherein the radial connector is connected between the first leg and the second leg.

3. The antenna arrangement as recited in claim 2, wherein the first leg is substantially perpendicular to the first plane adjacent to the outer loop and wherein the second leg is substantially perpendicular to the second plane adjacent to the inner loop.

4. The antenna arrangement as recited in claim 3, wherein the outer loop is a first distance from the window, and wherein the radial connector is a second distance from the window, wherein the second distance is at least three times the first distance.

5. The antenna arrangement as recited in claim 4, wherein the inner loop is coaxial and coplanar with the outer loop.

6. The antenna arrangement as recited in claim 5, further comprising a dielectric medium is disposed between the inner loop and outer loop to eliminate arcing therebetween.

7. The antenna arrangement as recited in claim 5 wherein the inner loop and outer loop have a combined length that is smaller than the wavelength of energy transmitted through the antenna arrangement.

8. The antenna arrangement as recited in claim 5, wherein the outer loop further comprises a second outer loop turn disposed around the antenna axis, and wherein the inner loop further comprises a second inner loop turn disposed around the antenna axis.

9. The antenna arrangement as recited in claim 8 wherein the second outer loop turn is disposed above the first outer loop turn and wherein the second inner loop turn is disposed above the first inner loop turn, and wherein the first outer loop turn and the first inner loop turn effectively shield a terminal voltage of the second outer loop turn and the second inner loop turn.

10. The antenna arrangement as recited in claim 8, further comprising a dielectric medium is disposed between the first outer loop turn, the second outer loop turn, the first inner loop turn, and the second inner loop turn to eliminate arcing there between.

11. The antenna arrangement as recited in claim 5, further comprising an RF power source coupled to the inner loop and the outer loop.

12. The antenna arrangement as recited in claim 11, wherein the inner loop and the outer loop cooperate to form an azimuthally symmetric electric field inside the process chamber with an RF energy generated by the RF power source, wherein the azimuthally symmetric electric field forms a substantially azimuthally symmetric plasma, which produces a substantially uniform process rate across a surface of a substrate disposed inside of the process chamber.

13. The antenna arrangement as recited in claim 5, further comprising a first lead electrically connected to the inner loop and a second lead electrically connected to the outer loop.

14. The antenna arrangement as recited in claim 1, wherein the outer loop is a first distance from the window, and wherein the radial connector is a second distance from the window, wherein the second distance is at least three times the first distance.

15. The antenna arrangement, as recited in claim 1, wherein at least one of the first outer loop turn and first inner loop turn is a complete notched turn.

16. The antenna arrangement, as recited in claim 15, wherein at least one of the second outer loop turn and second inner loop turn has an azimuthal gap a radial distance away from the antenna axis, further comprising a partial turn to span the azimuthal gap wherein the partial turn is located at a radial distance from the antenna axis that is equal to the radial distance the azimuthal gap is from the antenna axis.

17. A plasma processing apparatus for processing a substrate, comprising:
    a process chamber in which a plasma is both ignited and sustained for said processing;
    a window forming a side of the process chamber configured to allow the passage of RF energy into the process chamber; and
    a multi-layered antenna adjacent to the window and configured to produce an electric field via RF energy inside said process chamber, comprising:
        an outer loop, comprising a first outer loop turn disposed around the antenna axis;
        an inner loop, comprising a first inner loop turn disposed around the antenna axis, wherein the inner loop is closer to the antenna axis than the outer loop is to the antenna axis in each azimuthal direction; and
        a radial connector radially electrically connecting the outer loop to the inner loop, wherein the radial connector is placed a large distance from the window.

18. The plasma processing apparatus as recited in claim 17, wherein the outer loop is a first distance from the window, and wherein the radial connector is a second distance from the window, wherein the second distance is at least three times the first distance.

19. A turn for forming an antenna, comprising
    a complete notched turn comprising a turn formed around an antenna axis and with a first end and a second end, wherein the first end is notched forming a first cantilever portion and wherein the second end is notched forming a second cantilever portion;
    a first electrical connector connected to the first cantilever portion; and
    a second electrical connector connected to the second cantilever portion, wherein the first electrical connector and the second electrical connector lie along a common radius passing through the antenna axis.

* * * * *